United States Patent
Chen et al.

[11] Patent Number: 6,044,483
[45] Date of Patent: Mar. 28, 2000

[54] ERROR PROPAGATION OPERATING MODE FOR ERROR CORRECTING CODE RETROFIT APPARATUS

[75] Inventors: Chin-Long Chen, Fishkill, N.Y.; Timothy Jay Dell, Colchester, Vt.; Wayne C. Kwan, Wappingers Falls, N.Y.

[73] Assignee: International Business Machines Corporation, Armonk, N.Y.

[21] Appl. No.: 09/015,874

[22] Filed: Jan. 29, 1998

[51] Int. Cl.⁷ .................................................. H03M 13/00
[52] U.S. Cl. .............................. 714/762; 714/746; 714/48
[58] Field of Search ...................................... 714/762, 746, 714/48

[56] References Cited

U.S. PATENT DOCUMENTS

| | | | |
|---|---|---|---|
| 4,277,844 | 7/1981 | Hancock et al. | 371/38 |
| 4,450,561 | 5/1984 | Gotze | 371/37 |
| 4,506,365 | 3/1985 | Collins | 714/761 |
| 5,127,014 | 6/1992 | Raynham | 371/37.3 |
| 5,263,032 | 11/1993 | Porter et al. | 371/40.2 |
| 5,278,847 | 1/1994 | Helbig, Sr. et al. | 371/40.2 |
| 5,369,650 | 11/1994 | Kirk et al. | 371/40.1 |
| 5,379,304 | 1/1995 | Dell | 371/40.1 |
| 5,450,422 | 9/1995 | Dell | 371/40.1 |
| 5,452,418 | 9/1995 | Tatosian et al. | 395/250 |
| 5,465,262 | 11/1995 | Dell | 371/49.3 |
| 5,490,155 | 2/1996 | Abdoo et al. | 371/40.1 |
| 5,623,506 | 4/1997 | Dell et al. | 371/40.1 |

*Primary Examiner*—Phung M. Chung
*Attorney, Agent, or Firm*—Marc A. Ehrlich

[57] ABSTRACT

A method and apparatus are described for providing error correcting code (ECC) which may be incorporated into a computer system which includes one of a plurality of memory configurations and which may include a pre-existing error control feature. A data store operation causes the receipt of a word including data bits and check bits generated by a pre-existing error control feature. The data and check bits of the received word are used to generate additional check bits based upon the configuration of the computer system memory. The additionally generated check bits are stored in the memory along with the received word. Upon a subsequent data fetch operation which retrieves the word and check bits the check bits are decoded thereby providing error detection and correction in the retrieved word for single and multiple bit errors including the failure of an entire memory chip. The invention provides 84/72 ECC for computer systems having a four bit per chip memory configuration and 88/72 ECC for computer systems having an eight bit per chip memory configuration. Further embodiments provide downstream error notification propagation for the host computer system.

20 Claims, 10 Drawing Sheets

ERROR PROPAGATION OPERATING MODE FOR ERROR CORRECTING CODE RETROFIT APPARATUS

CROSS-REFERENCE TO RELATED APPLICATIONS

The present invention is related and cross-reference may be had to the U.S. patent application assigned IBM docket number PO9-97-124 entitled "ERROR CORRECTING CODE RETROFIT METHOD AND APPARATUS FOR MULTIPLE MEMORY CONFIGURATIONS", filed on Dec. 3, 1997, Ser. No. 08/984,240; by the present inventors and assigned to the present assignee.

FIELD OF THE INVENTION

The present invention is generally related to the field of computer system design, and particularly to the integration of a robust error correcting code mechanism into an existing computer system having one of a number of different memory configurations. Without loss of generality, the invention is particularly suited for incorporation within an existing computer system such as a personal computer having a single error correct error correcting mechanism or parity error control mechanism to provide multiple error detection, correction and notification including chip kill error detection, correction and notification facilities therefor.

BACKGROUND OF THE INVENTION

A variety of factors including faulty components and inadequate design tolerances may result in errors in the data being processed by a computer. These errors also commonly occur during data transmission due to "noise" in the communication channel. As a result of these errors, one or more bits, which may be represented as X, which are to be transmitted within the system, are corrupted so as to be received as /X (i.e. the logical complement of the value of X). In order to protect a computer system against such errors, the data bits may be coded via error correcting code (ECC) in such a way that the errors may be detected and possibly corrected by special ECC logic circuits. A typical ECC implementation appends a number of check bits to each data word. The appended check bits are used by the ECC logic circuits to detect errors within the data word.

The simplest and most common form of error control is implemented through the use of the parity bit. The single parity bit is appended to the data word and assigned to be either a 0 or a 1, so as to make the number of 1's in the data word even in the case of even parity codes, or odd in the case of odd parity codes.

Prior to the transmission of the data word in a computer system, often upon the initial storage of the data word, the value of the parity bit is computed at the source point and appended to the data word. Upon receipt of the transmitted data word, logic at the destination point recalculates the parity bit and compares it to the received, previously appended parity bit. If the recalculated and received parity bits are not equal a single bit error has been detected. Specifically, this means that a single data bit in the data word has transitioned from its original value, for example 1 to 0 or 0 to 1. If the received and recalculated parity bits are equal, then it can be concluded that such a single bit error did not occur, however multiple bit errors may not be ruled out. For example, if a data bit changes from a 0 to a 1 and another data bit changes from a 1 to a 0 (i.e. a double bit error) the parity of the data word will not change and the error will be undetected. Thus, use of the parity bit provides single error detection, however, it fails to detect every multiple even bit error, and it fails to provide information on the location of the erroneous bit(s).

By appending additional parity bits to the data word, each corresponding to a subset of data bits within the data word, the parity bit concept may be easily expanded to provide the detection of multiple bit errors or to determine the location of single or multiple bit errors. Once a data bit error is located it is a simple matter to cause a logic circuit to correct the located erroneous bit, thereby providing single error correction (SEC). Many single error correction codes have the ability to detect double errors and are thus termed single error correcting double error detecting codes (SEC-DED).

Multiple error detection schemes rely on appending additional check bits to the data word. The most well-known SEC-DED ECC is the so-called Hamming code, which appends a series of check bits to the data word as it is stored in memory. Upon a read operation, the retrieved check bits are compared against recalculated check bits to detect, locate and correct a single bit error. By adding more check bits and appropriately overlapping the subsets of data bits represented thereby, other error correcting codes have been devised for providing three bit error detection and two bit error correction, and, via the further addition of check bits, codes can be formulated to detect and correct any number of data bit errors.

The use of such robust forms of ECC has long been recognized as a necessity for the main storage on large computer systems such as the S/390 Parallel Enterprise Server—Generation 3 and the S/390 Parallel Enterprise Server—Generation 4 computer systems available from IBM Corporation (S/390 and IBM are registered trademarks, and S/390 Parallel Enterprise Server is a trademark of IBM Corporation). Since the main storage on such large systems often serves as the central data repository accessed by disparate users throughout an enterprise, the criticality of preserving the integrity of the massive amount of data stored on such large systems is readily apparent. Accordingly, large system customers have long demanded that their systems incorporate a form of multiple error detecting and correcting ECC.

With the advent of the network centric model for computer systems and with the increased power available in relatively small computer systems, the role of the server has increasingly become a shared role, with the traditional high-end mainframe computers operating at one extreme, and small PC-based servers operating at the other extreme. Until recently, small PC-based servers which serve either a departmental, office or workgroup network did not include even rudimentary SEC ECC. Many commercially available PCs still implement parity bit error control schemes, which as previously shown, are not adequate protection against all double bit errors and do not offer any error correction facilities.

Cognizant of the newly created need to provide a more robust ECC to these small scale servers, companies have begun to offer retrofit mechanisms such as ECC-on-SIMM (single in-line memory module) or "EOS" (available from IBM Corporation) which transparently implements a compatible, self-contained, on-SIMM, SEC ECC into an existing parity PC system. The underlying concepts of the EOS product are embodied in U.S. Pat. No. 5,623,506, issued to Dell et al., U.S. Pat. No. 5,465,262, issued to Dell et al., U.S. Pat. No. 5,450,422, issued to Dell, and U.S. Pat. No. 5,379,304 issued to Dell et al. Each of the foregoing patents are assigned to IBM Corporation the present assignee hereof and are incorporated herein by reference. With the availability of such products, the server owner may upgrade his/her server to include SEC ECC without having to change the planar/motherboard, memory controller, or operating system software. Additionally, memory controller chip sets which support SEC ECC are becoming increasingly commercially available. Moreover, microprocessor manufacturers are now beginning to offer SEC ECC support in their products such as the Intel Pentium Pro Microprocessor (Intel and Pentium are registered trademarks of Intel Corporation).

While these SEC ECC retrofit products offer increased protection for the PC-based servers, their ECC is limited and will not, for example, correct multiple data bit errors such as would be experienced upon the failure of an entire dynamic random access memory (DRAM) chip, without the addition of special high-end architectural techniques which would prove prohibitively costly for the consumer of PC-servers.

Accordingly, there exists a need for a simple, transparent mechanism by which a user may retrofit a more robust ECC to an existing SEC ECC or parity based computer system. In order for such a solution to prove effective, the mechanism should be cost efficient, and totally compatible with the existing computer system. The retrofit mechanism must enable the correction of an entire DRAM chip failure and preferably would be compatible with commercially available DRAM chips whether organized with four data bits per chip or with eight data bits per chip. Finally, the retrofit mechanism should be provided in an efficient and practical manner that will facilitate easy implementation in a commercially available application specific integrated circuit (ASIC).

With such a solution, a server owner may easily upgrade the ECC for his/her server without undergoing the labor and expense of modifying the processor or controller hardware or changing the operating software therefor. As such, the level of data integrity in the server may be easily scaled in accordance with the storage and access requirements thereof.

The advantages provided by the aforementioned retrofit ECC schemes precipitate a new set of issues to be resolved by the server owner. In particular, the ability to transparently enhance error correction for the computer system via the addition of a new error correction apparatus may prevent the computer system from properly tracking the frequency of errors being transparently corrected via this new device.

For example, in a computer system implementing parity error control and having an IBM EOS upgrade to enable SEC ECC therein, the EOS SIMM will correct all single bit errors without notifying the original error control logic of the computer system of the occurrence of these errors. Without such notification, the computer system cannot utilize its existing error control logic to determine, based upon the errors from the SIMMs, if it is necessary to initiate a maintenance notification so as to replace a SIMM that has been accumulating errors. Failure to notify the system of such accumulating errors for a SIMM could lead to a condition wherein more than one bad bits are aligned in a single ECC word, which would constitute an uncorrectable error for such a system.

Likewise, as the retrofit ECC enhancing mechanism provides greater and greater error correcting capacity, as in the aforementioned inventive DRAM chip correction retrofit apparatus, the ability of the original system to properly recognize and respond to accumulating SIMM errors is correspondingly diminished with the concomitant consequence of failing to permit the detection and notification of a maintenance requirement.

In certain systems implementing the IBM EOS ECC enhancement, the problem has been addressed by installing special hardware, which, when added to the memory subsystem, permits the error control logic to sense error lines of the EOS SIMM. A special version of the EOS SIMM has been devised to bring error lines to the SIMM tabs, and to activate them upon the correction of an error. This solution, however, requires a hardware change to the existing computer system and as such is inconsistent with the objectives of the EOS device in that with such hardware modifications, the EOS device ceases to transparently implement the ECC upgrade.

Accordingly, there exists a further need to provide a transparent mechanism for notifying the original error control logic in computer system having an ECC enhanced retrofit device that the enhanced ECC device has corrected an error. With such a solution the original computer system error control logic will retain the ability to determine the accumulation of errors and implement a preventative maintenance strategy accordingly. Consequently, error correction and maintenance operations are transparently enhanced within the original computer system by virtue of the inventive apparatus.

SUMMARY OF THE INVENTION

The foregoing problems and shortcomings of the prior art are overcome and further advantageous features are provided by the present invention wherein a method and apparatus for implementing an ECC which is compatible with a 4 data bit per chip, or 8 data bit per chip memory arrangement, in a computer system which may implement a single error control mechanism, is provided for performing error detection and correction on data to be read from one or more memory chips and wherein the ECC implements error detection and correction techniques which enable the detection and correction of single and multiple data bit errors including without limitation entire memory chip failures.

In a preferred embodiment of the invention the ECC logic is included in a commercially available ASIC chip included on a dual in-line memory module (DIMM) card which may be easily installed as a retrofit for an existing computer system memory. The ECC circuits receive data from the system data bus which is typically 2(n)+1 bytes wide (where n is a positive integer) and in a preferred embodiment is 72 bits wide (i.e. 9 bytes). The width of the data bus in this embodiment is calculated so as to include 64 bits (8 bytes) of data and an additional 8 check bits (1 byte) which may be generated by any existing ECC mechanism such as SEC or parity error control within in the computer system. By incorporating the existing check bits into the ECC algorithm, the inventive ECC circuits will successfully perform error correction and detection irrespective of any existing ECC in the computer system thereby allowing a seamless ECC retrofit.

In an embodiment of the invention the ECC apparatus comprises a first I/O buffer for receiving the 72 bits from the system data bus upon the occurrence of a write command in the computer system. The received 72 bits are passed to a check bit generation circuit for generating the check bits required for the inventive ECC. The check bit generator further receives the mode bit which instructs the check bit generator as to whether to generate check bits for a 4 bit or 8 bit memory chip configuration. Thereafter, the received bits along with the generated check bits are passed through a second I/O buffer for storage in the memory chips.

Upon the occurrence of a read instruction in the computer system, the stored 72 bits and the associated check bits are passed from the memory chips back through the second I/O buffer and thereafter to the error detection unit. The error detection unit additionally receives the mode bit which instructs the error detection unit to perform error detection operations based upon either a 4 bit per chip or 8 bit per chip memory configuration. Once instructed, the error detection unit performs the appropriate logic operations to determine whether errors are present in the bits read from memory. The error detection unit further includes logic means for evaluating the location of a detected error within the 72 bit word. Thereafter, the 72 bits are passed to the error correction unit. If an error is detected by the error detection circuit and is capable of correction, a signal is passed from the error detection circuit to the error correction circuit, which in turn performs the necessary logic operations to correct the erroneous bit(s) in the 72 bit word read from the memory chips. After any required correction has been completed the 72 bits are passed from the error correction circuit back through the first I/O stage and back onto the system data bus for use by the computer system.

In a further embodiment of the invention, uncorrectable errors such as those involving bits which physically reside within separate memory chips may be identified and the computer system informed accordingly.

In yet another embodiment, the invention includes a mechanism for sensing the performance of an error correction operation by the ECC and corresponding logic for notifying the original computer system error control logic each time an error has been corrected by the inventive ECC logic. The sensing and notification mechanism comprises an error sensing means which detects the existence of an error in the data word, and forcing means for intentionally causing an error within ECC word which has undergone error correction via the ECC logic. The intentional error will be of the type that is readily detected and corrected by the error control logic in the original computer system, thereby serving as a notification to the computer system that an error has occurred and allowing the implementation of various system maintenance strategies therein. In a preferred embodiment, the error forcing means inverts the logic state of a single predetermined bit in the ECC word, in such a manner that the downstream SEC ECC in an original computer system can correct the intentionally forced error. Moreover, the error forcing means include logic for ascertaining whether the predetermined error notification bit is in error to prevent the inversion of this bit to its correct logic state so as to obviate the downstream notification function. With such an implementation the error correction, notification and maintenance capacity of the original computer system are each transparently enhanced.

The present inventive method and apparatus provide a robust ECC which may be seamlessly incorporated into a computer system. Without limitation, the invention may be implemented on computer systems having a pre-existing error control mechanism, and is compatible with a plurality of memory configurations.

BRIEF DESCRIPTION OF THE DRAWINGS

The subject matter which is regarded as the invention is particularly pointed out and distinctly claimed at the conclusion of the specification. The foregoing as well as other features and advantages of the invention will be apparent from the following detailed description in conjunction with the accompanying drawings, in which:

DETAILED DESCRIPTION OF THE PREFERRED EMBODIMENTS OF THE INVENTION

The emerging role of the small to mid-sized PC-based server as a standard element of a networked enterprise has moved such relatively small computer systems, heretofore intended for advanced desktop uses, into the role of the network server, storing data to be accessed by numerous users throughout an enterprise. As the number of users accessing this new type of server has grown, so has the requirement of ensuring the integrity of the data stored therein. Accordingly, the need to upgrade the ECC in existing computer systems in order to detect and correct multiple data bit errors including those multiple data bit errors caused by the failure of an entire single DRAM chip, has recently become an important consideration of network system owners. Thus, the present invention, which provides an expedient ECC solution which may, without limitation, be easily incorporated into a computer system having a preexisting level of error control, will prove useful to the administrators of networked computer systems comprising one or more relatively small servers which may be PC-based workstations, or mid-range computers.

While the present invention has a practical application as a retrofit ECC for improving the error correction for an existing computer system with single error control means, the invention may additionally prove useful for computer systems having no existing error control mechanism. In particular, use of the present invention in a system with no error control will provide multiple data error detection and correction capabilities including the ability to detect and correct and entire memory chip failure in systems having one of a plurality of memory configurations. For ease of understanding we will focus our detailed description on an embodiment portraying implementation of the present inventive ECC in a computer system having an existing error control mechanism, however it will be apparent, via the ensuing description, that the same techniques and apparatus may be applied to a system having no error control means to provide analogous benefits and advantages therefor.

Figure 1:
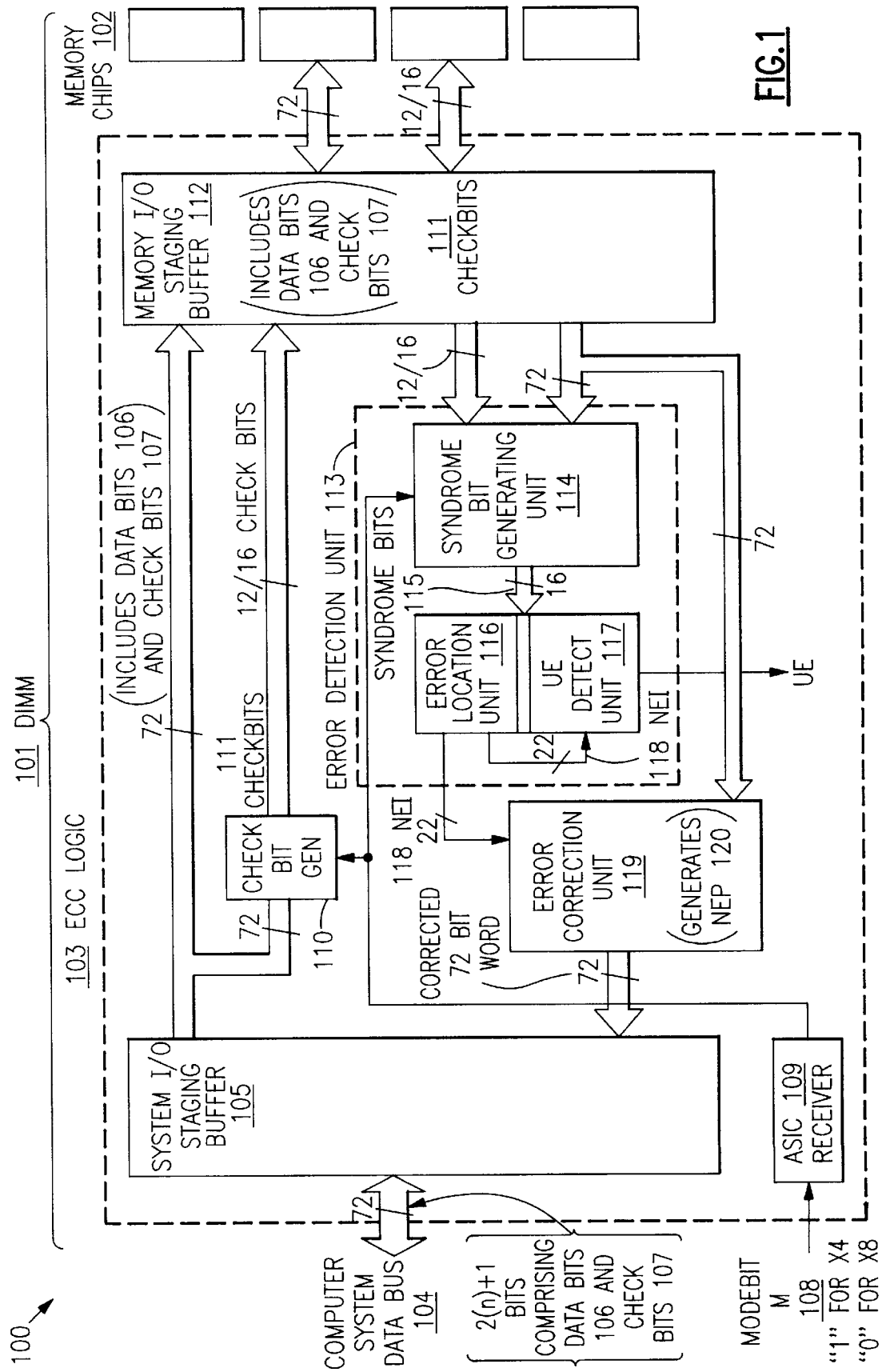
FIG. 1 illustrates an overview of the inventive ECC logic design.

Turning now to our invention in greater detail, reference may be had to FIG. 1 wherein a block diagram 100 generally representing the functional aspects of an embodiment of the present inventive apparatus is shown. The apparatus is preferably included on a dual in-line memory module (DIMM) card 101 along with one or more memory chips 102, and may without limitation, be easily implemented within a commercially available ASIC chip. The ASIC chip would serve to interconnect the data bus 104 of the computer system (not shown) to the memory chips 102 which would typically be DRAMs. In this manner, data passing from the computer system data bus 104 to the memory chips 102 during execution of a write operation would pass through the ECC circuitry 103 on the ASIC prior to storage in the memory chips 102. Likewise, data passing from the memory chips 102 to the computer system data bus 104 during the execution of a read operation would also pass through the ECC circuitry 103 on the ASIC. Accordingly, the error correction mechanism operates on data as it is being stored by the computer system in the memory chips 102 as well as on that same stored data along with check bits as it is being read by the computer system from the memory chips.

Data being passed to the memory chips 102 during a write operation passes first to the system I/O staging buffer 105 within the ASIC chip. The system I/O staging buffer 105 is a bidirectional buffer which controls the data movement in both directions between the computer system data bus 104 and the ECC logic 103. In an embodiment of the invention in which the computer system includes pre-existing error control circuitry, the data received at the system I/O staging buffer 105 would include data bits 106 as well as check bits 107. Typically, for a 64 bit data bus 104 in a system employing single-error control, 8 check bits are generated. In such a system the system I/O staging buffer must be 72 bits wide (i.e. 64 data bits (106)+8 check bits (107)=72 bits). It will be understood herein that the present invention may be implemented in a manner consistent with the present description on any width data bus. Since it is typically the case that a computer system employs 2(n) bytes of data (where n is a positive integer), and would add a byte of check bits to implement its pre-existing error control mechanism, such a computer system providing 2(n)+1 bytes of data and check bits combined could seamlessly incorporate an ECC retrofit in accordance with the present invention.

Upon receipt of the 72 bits from the data bus 104 at the system I/O staging buffer 105, the mode bit 108 is read by the ASIC receiver 109. The mode bit setting, which is preferably set at the time that the DIMM 101 is assembled, is determined by the type of memory chips 102 that are incorporated onto the DIMM 101. In one embodiment, the mode bit would be tied to Vcc (or would otherwise exhibit a logical level "1" at the ASIC receiver 109) for DIMMs 101 including a 4 bit per chip memory configuration, and would be tied to GND (or would register a logical "0" level at the ASIC receiver 109) for DIMMs 101 including an 8 bit per chip memory configuration.

After receipt of the data from the system data bus 104 and registration at the ASIC receiver 109 of the mode bit 108, the system I/O staging buffer 105 passes the received 72 bits to the check bit generator circuit 110 and to the memory I/O staging buffer 112 for further storage in the memory chips 102.

The check bit generator circuit 110 includes logic, which will subsequently be described, for encoding the 72 bit word including data bits 106 and check bits 107 so as to provide the check bits 111 required for carrying out the inventive ECC for the present invention. Since the inventive error correction mechanism must be able to determine memory chip failures, and since the DIMM may incorporate either 4-bit per chip or 8 bit per chip DRAMS, the check bit generator circuit 110 additionally receives the state of the mode bit from the ASIC receiver 109, which in turn determines which check bit generation encoding is to be performed thereby. For example, and via reference to FIG. 1, if the DIMM 101 includes 4 bit per chip DRAMs, then 12 check bits 111 are generated by the check bit generator 110, and if the DIMM includes 8 bit per chip DRAMs, the check bit generator 110 generates 16 check bits 111 to append to the 72 bit word received from the data bus 104. Thus, in the preferred embodiment incorporating a 72 bit word from the computer system, the invention generates either (88,72) or (84,72) error correcting code depending upon the type of memory chips 102 present in the computer system.

The check bits 111 (either 12 or 16 bits) are in turn passed from the check bit generator 110 to the memory I/O staging buffer 112 along with the 72 bit word. The memory I/O staging buffer 112 is a second bidirectional buffer, which controls the data movement between the ECC logic 103 and the memory chips 102. In a preferred embodiment, the system I/O staging buffer 105 passes the 72 bits received from the system data bus 104 to the memory I/O staging buffer 112 and to the check bit generator 110. Subsequently, the 12 or 16 check bits 111 generated by the check bit generator 110 are passed to the memory I/O staging buffer 112. Once the either 84 or 88 bits have been buffered at the memory I/O staging buffer 112, the buffered word may be stored in the memory chips 102 which are coupled to the staging buffer 112, thereby completing the execution of the write operation.

Upon the subsequent issuance of a read command for the stored data, the 84 or 88 bits are read from the memory chips 102 in which they have been stored, into the memory I/O staging buffer 112. From there, the 12 or 16 check bits 107 and the 72 data bits 106 are passed onto the error detection unit 113. The error detection unit regenerates the check bits 111 based on the 72 bit word and compares the regenerated check bits to the stored check bits to determine whether there are any errors in the data read from the memory chips 102. Once the error determination has been completed, the error detection unit identifies the location of the erroneous bit(s) and notes the occurrence of so-called "uncorrectable errors" (or UEs) as will subsequently be described.

The check bit regeneration and comparison function is carried out within the error detection unit 113 by the syndrome bit generation unit 114. The syndrome bit generation unit 114 provides 16 syndrome bits 115 which indicate whether any single or multiple bit errors have occurred within the 72 bit data word which would include, without limitation, the failure of an entire DRAM chip. Since the generation of the syndrome bits requires the regeneration of the check bits for the 72 bit word, the syndrome generation unit 114, similar to the check bit generation circuit 110 is coupled to the ASIC receiver 109 for sampling the state of the mode bit 108. If the syndrome bits 115 are not all equal to zero then a single or multiple bit error exists. Once the non-zero syndrome bits have been generated they must be decoded to localize the erroneous bit(s) so as to affect error correction.

The decoding of the syndrome bits takes place within the error detection unit 113 in the error location 116 and UE detection 117 units. The syndrome bits 115 generated by the syndrome bit generation unit 114 are passed to the error location unit 116. At the error location unit 116 the 4 bit nibble(s) of the 72 bit data word which contains the detected errors are identified by decoding the syndrome bits 115 into single bit nibble error indicators (NEI) 118 each of which represents a nibble of the 72 bit word. Once the error has been localized it may be corrected via logic operations which are performed within the error correction unit 119.

The UE detection unit 117 within the error detection unit 113 is capable of detecting errors which are incapable of being corrected using the present inventive ECC mechanism. Such uncorrectable errors are within the present ECC mechanism may occur upon the failure of more than one of the memory chips 102. The ability to correct more than a single failed memory chip is achievable within the context of the present invention, however such a robust ECC would require the generation of more check bits which in turn requires further storage capacity of the memory chips 102. Thus, further error correction than described herein is achievable, albeit at an additional cost and is intended to fall within the scope of the present invention. UE detection within the UE detection unit 117 is performed via a logic operation utilizing, inter-alia, the NEIs 118 generated in the error location unit 116.

If the error detection unit 113 identifies a single or multiple bit error in the 72 bit word, the NEI 118 is passed from the error location unit 116 within the error detection unit 113, to the error correction unit 119. The error correction unit also receives the original 72 bit word retrieved from the memory I/O staging buffer 112. Within the error correction unit 119, the NEI 118 is converted into a nibble error pattern 120 which is logically combined with the corresponding data nibble of the 72 bit word which contains the erroneous bit(s) thereby correcting the erroneous bits. The corrected 72 bit word is thereafter passed from the error correction unit 119 back to the system I/O staging buffer 105 and thereafter onto the system data bus 104 from which the data to be read is used by the computer system completing the read operation.

CHECK BIT GENERATION

With the foregoing overview of the inventive ECC techniques as a background we will now turn to the specific operation of each of the functional blocks therein, including the check bit generation circuit 110, the syndrome bit generation unit 113, the error location unit 116, the UE detection unit 117 and the error correction unit 119.

In order to generate the check bits 111 for the 72 bit word of the preferred embodiment, the exemplary check bit generation circuit 110, employs a 3 row×21 column ($H_1$) and a 4 row×22 column ($H_2$) parity check matrix respectively for the 4 bit per memory chip and 8 bit per memory chips DIMM configurations. The parity check matrices ($H_1$ and $H_2$) are illustrated below in Table 1:

TABLE 1

A. $H_1$ Parity Check Matrix for 4 bit per chip memory arrangement for generation of 12 check bits.
$H_1 =$

| | | | | | | | | | DATA | | | | | | | | | | ECC | | |
|---|---|---|---|---|---|---|---|---|---|---|---|---|---|---|---|---|---|---|---|---|---|
| D0 | D1 | D2 | D3 | D4 | D5 | D6 | D7 | D8 | D9 | D10 | D11 | D12 | D13 | D14 | D15 | D16 | D17 | | C0 | C1 | C2 |
| I | 0 | T1 | 0 | T2 | 0 | T3 | 0 | T4 | 0 | T5 | 0 | T6 | 0 | T7 | 0 | T8 | 0 | | I | 0 | 0 |
| 0 | I | 0 | T1 | 0 | T2 | 0 | T3 | 0 | T4 | 0 | T5 | 0 | T6 | 0 | T7 | 0 | T8 | × | 0 | I | 0 |
| I | I | I | I | I | I | I | I | I | I | I | I | I | I | I | I | I | I | | 0 | 0 | I |

B. $H_2$ Parity Check Matrix for 8 bit per chip memory arrangment for generation of 16 check bits.
$H_2 =$

| | | | | | | | | | DATA | | | | | | | | | | ECC | | | |
|---|---|---|---|---|---|---|---|---|---|---|---|---|---|---|---|---|---|---|---|---|---|---|
| D0 | D1 | D2 | D3 | D4 | D5 | D6 | D7 | D8 | D9 | D10 | D11 | D12 | D13 | D14 | D15 | D16 | D17 | | C0 | C1 | C2 | C3 |
| I | 0 | T1 | 0 | T2 | 0 | T3 | 0 | T4 | 0 | T5 | 0 | T6 | 0 | T7 | 0 | T8 | 0 | | I | 0 | 0 | 0 |
| 0 | I | 0 | T1 | 0 | T2 | 0 | T3 | 0 | T4 | 0 | T5 | 0 | T6 | 0 | T7 | 0 | T8 | × | 0 | I | 0 | 0 |
| I | 0 | I | 0 | I | 0 | I | 0 | I | 0 | I | 0 | I | 0 | I | 0 | I | 0 | | 0 | 0 | I | 0 |
| 0 | I | 0 | I | 0 | I | 0 | I | 0 | I | 0 | I | 0 | I | 0 | I | 0 | I | | 0 | 0 | 0 | I |

In the foregoing tables, matrices $H_1$ and $H_2$ are multiplied by the data bits to generate the check bits 111. In the $H_1$ and $H_2$ matrices, the 18 data headings D0–D17 represent 4-bit nibbles of the 72 bit data word such that D0=data bits 0–3 (i.e. DQ0, DQ1, DQ2, and DQ3) and D17=data bits 68–71 (i.e. DQ68, DQ69, DQ70, and DQ71). Similarly, the ECC headings C0–C2 and C0–C3 in the check bit matrices represent 4-bit nibbles (or check bit vectors) of the check bits to be generated by the check bit generation circuit 110, such that C0=check bits 0–3, C2=check bits 8–11, and C3=check bits 12–15. Of course, in a DIMM including 4 bit per chip DRAMs the check bits 12–15 will be "don't care" values.

In the foregoing matrices each of the "0" values represents a 4×4 matrix of 0's and the "I" values in the matrices represent the identity matrix or a 4×4 matrix, which when multiplied by a data nibble D0–D17 yields the data nibble. For example:

$$\begin{vmatrix} 1 & 0 & 0 & 0 \\ 0 & 1 & 0 & 0 \\ 0 & 0 & 1 & 0 \\ 0 & 0 & 0 & 1 \end{vmatrix} * (DQ0, DQ1, DQ2, DQ3) = (DQ0, DQ1, DQ2, DQ3)$$

The T values in the $H_1$ and $H_2$ matrices represent the check bit generation matrices (CBGs) as listed below in Table 2:

TABLE 2

| T1: |0 0 0 1| | T2: |0 0 1 0| | T3: |0 1 0 0| | T4: |1 0 0 1| |
|     |1 0 0 1| |     |0 0 1 1| |     |0 1 1 0| |     |1 1 0 1| |
|     |0 1 0 0| |     |1 0 0 1| |     |0 0 1 1| |     |0 1 1 0| |
|     |0 0 1 0| |     |0 1 0 0| |     |1 0 0 1| |     |0 0 1 1| |
| T5: |0 0 1 1| | T6: |0 1 1 0| | T7: |1 1 1 0| | T8: |1 1 0 0| |
|     |1 0 1 0| |     |0 1 0 1| |     |0 0 0 1| |     |0 0 1 0| |
|     |1 1 0 1| |     |1 0 1 0| |     |1 0 0 0| |     |0 0 0 1| |
|     |0 1 1 0| |     |1 1 0 1| |     |1 1 0 0| |     |1 0 0 0| |

Based upon the parity check matrix multiplication presented above, the generation of check bits for the present invention may be explained via a two-step combinatorial process. In the first step, parity vectors P0–P3 are generated in accordance with the multiplication of the parity check matrices with the data bits to yield:

$P0 = D0 + (T1)D2 + (T2)D4 + (T3)D6 +$
$\quad\quad\quad\quad (T4)D8 + (T5)D10 + (T6)D12 + (T7)D14 + (T8)D16$ $P1 = D1 + (T1)D3 + (T2)D5 + (T3)D7 + (T4)D9 +$
$\quad\quad\quad\quad (T5)D11 + (T6)D13 + (T7)D15 + (T8)D17$ $P2 = D0 + D2 + D4 + D6 + D8 + D10 + D12 + D14 + D16$ $P3 = D1 + D3 + D5 + D7 + D9 + D11 + D13 + D15 + D17$ Wherein the "+" indicates an exclusive OR (XOR) operation.

Each of the parity vectors P0–P3 is a 4-bit nibble, wherein P0 consists of 4 bits (P0(0), P0(1), P0(2) and P0(3)) and so on. Accordingly, each of the foregoing parity vector equations may be expanded into a set of four equations. By way of example, for P0:

$P0(0) = DQ0 + DQ11 + DQ18 + DQ25 + DQ32 + DQ35 + DQ42 + DQ43 + DQ49 + DQ50 + DQ56 + DQ57 + DQ58 + DQ64 + DQ65;$ $P0(1) = DQ1 + DQ8 + DQ11 + DQ18 + DQ19 + DQ25 + DQ26 + DQ32 + DQ33 + DQ35 + DQ40 + DQ42 + DQ49 + DQ51 + DQ59 + DQ66;$ $P0(2) = DQ2 + DQ9 + DQ16 + DQ19 + DQ26 + DQ27 + DQ33 + DQ34 + DQ40 + DQ41 + DQ43 + DQ48 + DQ50 + DQ56 + DQ67;$ $P0(3) = DQ3 + DQ10 + DQ17 + DQ24 + DQ27 + DQ34 + DQ35 + DQ41 + DQ42 + DQ48 + DQ49 + DQ51 + DQ56 + DQ57 + DQ64.$

The same expansion may be carried out for P1, P2 and P3.

From these parity vectors, the set of 16 check bits 111 (12 for the 4 bit per chip DRAM DIMMs) included in the 4-bit nibbles (or check bit vectors) C0–C3 may be generated based upon the state ("1" for 4 bits per memory chip and "0" for 8 bits per memory chip) of the mode bit 108 (M), via the following equations:

$C0 = P0$ $C1 = P1$ $C2 = P2 + (M)P3$ $C3 = (/M)P3$

Wherein /M=the logical complement of the value of M.

From the foregoing it can be seen that check bits 0–3 (vector C0) and 4–7 (vector C1) are identical to the parity vectors P0 and P1 respectively. If the mode bit 108 is set to 0 as in the case of the 8 bit per chip memory arrangement, then check bits 8–11 (vector C2) are equal to the parity vector P2 and check bits 12–15 (vector C3) are equal to the parity vector P3. Alternatively, if the mode bit 108 is set to 1 as in the case of the 4 bit per chip memory arrangement, then check bits 8–11 (vector C2) are equal to the XOR of parity vectors P2 and P3 and check bits 12–15 (vector C3) would be set to 0. As we have previously noted, for the 4 bit per DRAM configuration, the vector C3 (check bits 12–15) are "don't care" bits.

Figure 2:
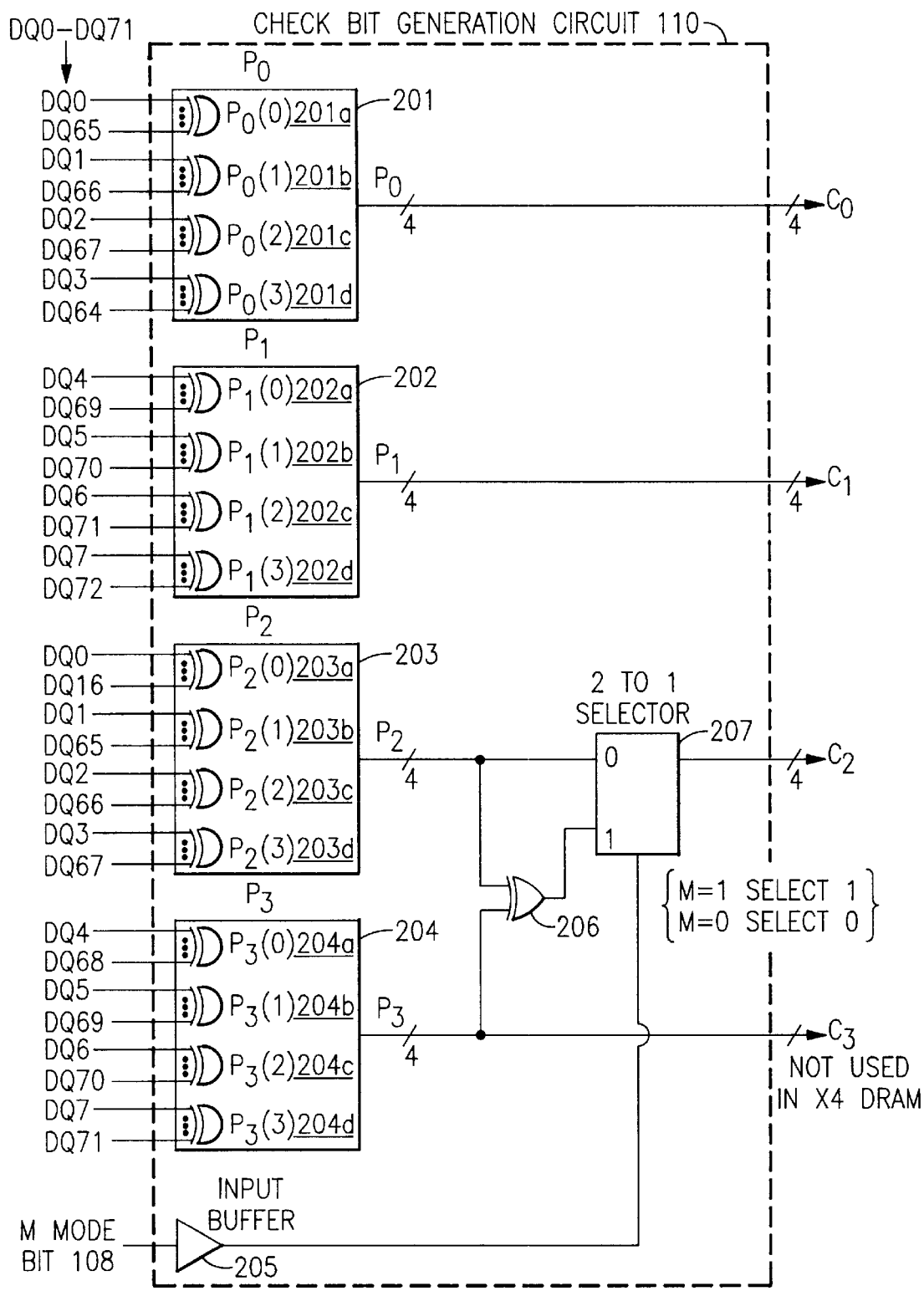
FIG. 2 depicts a detailed functional view of the check bit generation circuit.

In view of the foregoing we may now turn to FIG. 2, wherein a more detailed representation of the check bit generation circuit 110 is illustrated. The check bit generation circuit receives the 72 bit word DQ0–DQ71 which in the preferred embodiment includes data bits 106 and check bits 107 from the system I/O staging buffer 105 and the mode bit M 108 from the ASIC receiver 109. Within the check bit generation circuit 110, the 72 bits DQ0–DQ71 are received and input into a series of parity vector generation logic blocks 201–204 which respectively generate parity vectors P0–P3. Within each parity vector generation logic unit, four multiple input XOR gates (for example gates 201a–201d for parity vector generation logic 201) receive the appropriate bits from the 72 bit word, required to generate each bit of the 4-bit nibbles for P0–P3 (i.e. P0(0), P0(1), P0(2) and P0(3) for P0). Thus, as described above the XOR gate for P0(0) (XOR 201a) would receive bits DQ0, DQ11, DQ18, DQ25, DQ32, DQ35, DQ42, DQ43, DQ49, DQ50, DQ56, DQ57, DQ58, DQ64, and DQ65 from the 72 bit word (illustrated as inputs DQ0 * * * DQ65). For ease of illustration only a few illustrative input DQ lines are shown in FIG. 2, however it is to be understood that each of the XOR gates receives as input the DQ bits required to generate its particular parity bit within the parity vector. Upon receiving the appropriate data 106 bits and check bits 107 from the 72 bit word, the XOR gates generate each bit of the 4-bit nibbles comprising the parity vectors P0–P3, which are output from the parity vector generation logic blocks 201–204. As previously noted, irrespective of the DIMM memory configuration (for example, either 4 or 8 bits per chip), parity vectors P0 and P1 are equal to check bit vectors C0 and C1 respectively, which in turn comprise check bits 0–3 and 4–7 respectively. Accordingly, the output of the parity vector generation logic blocks 201 and 202 are output from the check bit generation circuit 110 as C0 and C1 respectively.

The value of check bit vectors C2 and C3 differ depending upon the memory configuration on the DIMM as represented by the state of the mode bit M 108. Referring to FIG. 2 we see that the mode bit M 108 from the ASIC receiver 109 is received at the input buffer 205 of the check bit generation circuit 110. The output (P3) of parity vector generation logic unit 204 is input to XOR gate 206 along with the output (P2) of parity vector generation logic unit 203. The output of the XOR gate 206 is in turn input into a 2 to 1 multiplexer 207 together with the output (P2) of parity vector generation logic unit 203. The multiplexer 207 selects either of these two inputs to be output based upon the state of the mode bit m 108, which is received at the multiplexer 207 from the input buffer 205. If the mode bit is equal to 0 as would be the case in an eight bit per chip memory configuration, the P2 input is selected by the multiplexer 207 to be output for the check bit vector C2 and the parity vector P3 is output as the check bit vector C3. Alternatively, if the mode bit M 108 is equal to 1 as would be the case in a four bit per chip memory configuration, the output selected by the multiplexer 207 is P2+P3 (from XOR gate 206) for the check bit vector C2 and the check bit vector is not used, so the values are "don't care" values.

The 12 to 16 check bits 111 generated by the check bit generation circuit 110 are passed along to the memory I/O staging buffer 112 wherein they are buffered along with and appended to the 72 bit word for storage in the memory chips 102 thereby completing a data store operation such as a write operation.

SYNDROME BIT GENERATION

Once a data storage operation has been completed and the 72 bit word DQ0–DQ71 along with the appended check bits 111 (vectors C0–C2 or vectors C0–C3) has been stored in the memory chips 102, the first stage of the inventive ECC is accomplished. The second stage of the ECC technique involves verifying, upon the execution of a data fetch operation (such as the execution of a read command) wherein the stored word is to be read from the memory chips 102, that the word read out of the memory is identical to the word that had previously been written into memory. As previously noted, the present invention provides a robust multiple bit error control capability that includes, without limitation, the ability to detect and correct errors resulting from the failure of an entire DRAM chip. The detection and location of these and other errors is carried out by the error detection unit 113, and therein, the syndrome bit generation unit 114 is responsible for detecting whether any errors have occurred within the fetched 72 bit word DQ0–DQ71.

The syndrome bits 115 generated by the syndrome bit generation unit 114 are the product of a comparison between the check bits 111 that were originally stored with the 72 bit word in the memory chips 102 during a data store operation such as the execution of a write command, and a new set of check bits 111 generated based upon the 72 bit word that has been fetched from the memory chips such as would occur in the execution of a read command in the computer system. If the retrieved check bits and the newly generated check bits are not identical, an error has occurred within the stored word within the 72 data bits or in the 12 to 16 check bits. Accordingly, to accomplish this comparison, it is necessary for the syndrome bit generation unit 114 to receive the 72 bit word from the memory chips 102 and to perform a check bit generation operation which is identical to the operation previously described for the check bit generation circuit 110.

Figure 3:
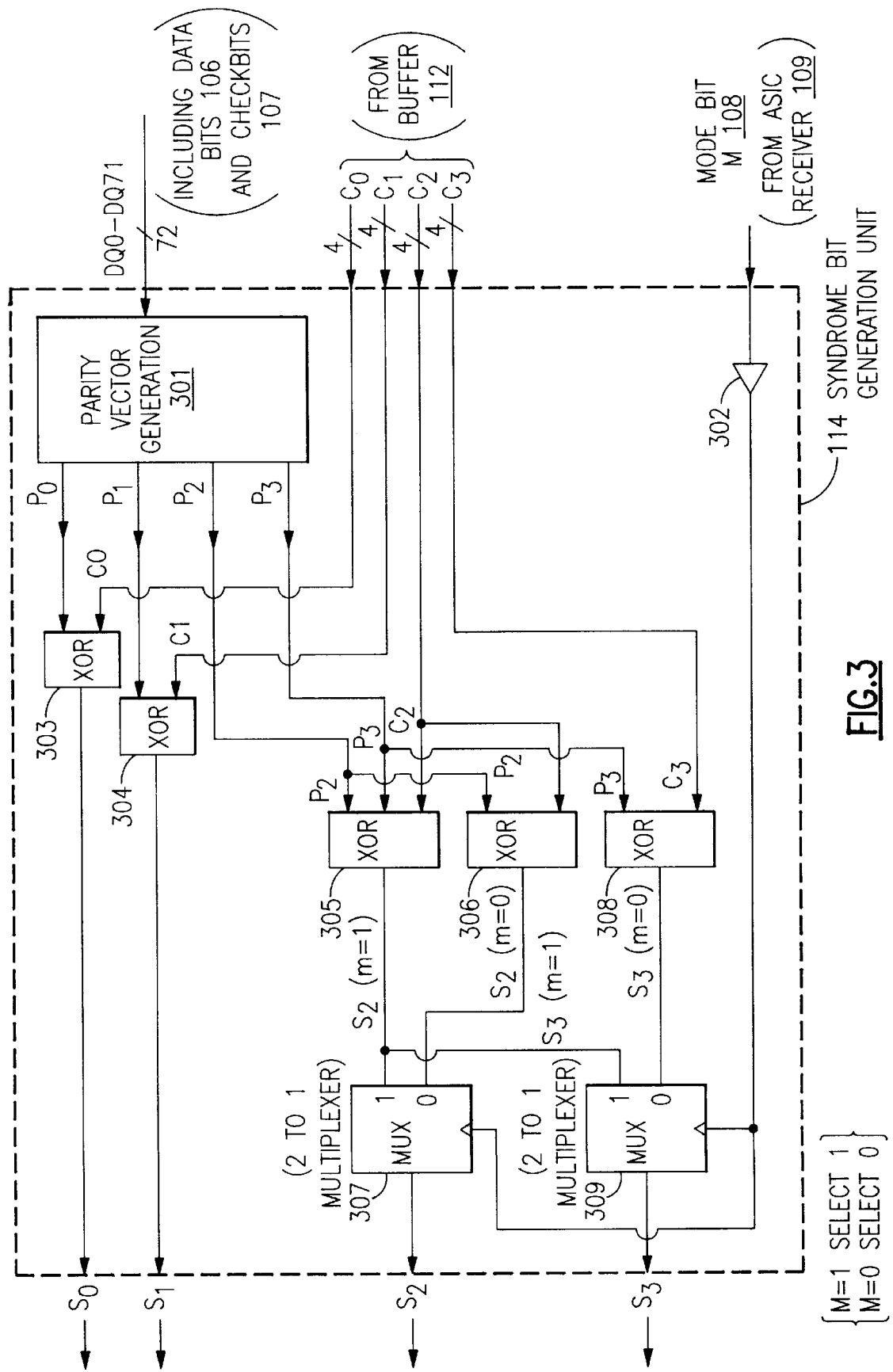
FIG. 3 depicts a detailed functional view of the syndrome bit generation unit.

With the foregoing as background we now may examine the function of the syndrome bit generation unit 114 in greater detail. FIG. 3 provides a block-level illustration of the functional components of the syndrome bit generation unit 114.

The 72 bit word DQ0–DQ71 including data bits 106 and check bits 107 is retrieved from the memory chips 102 upon the execution of a data fetch operation such as a read command and passed through the memory I/O staging buffer 112 to be input into the syndrome bit generation unit 114. Within the syndrome bit generation unit 114, the 72 bits are received by the parity vector generation block 301, which functions identically to the parity vector generation logic blocks 201–204 described in reference to the check bit generation circuit 110 illustrated in FIG. 2. The parity vector generation block 301 outputs parity vectors P0, P1, P2 and P3 based upon the retrieved values of the 72 bits DQ0–DQ71.

Since the syndrome bit generation unit 114 must use the newly generated parity vectors in a manner similar to the check bit generation circuit 110, the mode bit 108 M is likewise received by input buffer 302 at the syndrome bit generation unit's check bit generation logic, from the ASIC receiver 109. Finally, the stored values of the check bit vectors 111 (C0–C3) are fetched from the memory chips 102 through the memory I/O staging buffer 112 and received by the syndrome bit generation unit 114 for detecting the presence of errors in the retrieved word.

Generation of the syndrome bits 115 within the syndrome bit generation unit 114 is accomplished by combining the retrieved check bit vectors 111 with a corresponding set of newly generated check bit vectors. The generated syndrome bits 115 have a length of 16 bits irrespective of the memory arrangement on the DIMM. Syndrome vectors 115 S0, S1, S2, and S3, each being a 4-bit nibble, correspond to each of the check bit vectors C0, C1, C2 and C3 respectively. If the combination of the retrieved and regenerated check bit vectors create any non-zero syndrome bits, an error within the retrieved word has been detected. Specifically, the following equations are used to generate the syndrome vectors 115:

$$S0=C0+(P0)$$
$$S1=C1+(P1)$$
$$S2=C2+P2+(M)P3$$
$$S3=(/M)C3+(/M)P3+(M)S2$$

(wherein M=1 for 4 bit per chip DRAMs and M=0 for 8 bit per chip DRAMs)

Inspection of the foregoing equations reveal that syndrome vectors 115 S0, S1 and S2 are simply the XOR of the corresponding received check bit vector with the newly generated check bit vector (in the case of the 8 bit per chip memory configuration where M=1; S2=C2+P2+P3). The S3 syndrome vector is equal to the retrieved C3 XORed with the regenerated P3 for the eight bit per chip memory arrangement (where M=0) but S3 is equal to S2 for the 4 bit per chip memory arrangement (where M=1). This doubling of the S2 vector where M=1 is used to assist in locating an error in the error location unit 116.

Referring again to FIG. 3 we see that the parity vectors P0–P3 generated by the parity vector generation unit 301 are logically combined with the check bit vectors 111 C0–C2 (or C0–C3 as the case may be) received from the memory I/O staging buffer 112, to produce the syndrome vectors 115 in accordance with the foregoing equations. Specifically, S0 is generated by combining C0 and P0 in XOR gate 303, and S1 is generated by combining C1 and P1 in XOR gate 304. S2 is generated by combining P2, P3 and C2 in XOR gate 305 and combining C2 and P2 in XOR gate 306 and combining their respective outputs in the 2 to 1 multiplexer 307. Multiplexer 307 receives the mode bit M 108 from input buffer 302 and selects the output of XOR 305 (i.e. C2+P2+P3) as S2 if M=1, or alternatively selects the output of XOR 306 (C2+P2) as S2 if M=0. Likewise, S3 is generated by combining P3 and C3 in XOR gate 308 and combining the outputs of XOR gate 305 (i.e. C2+P2+P3) and XOR gate 308 (C3+P3) in a 2 to 1 multiplexer 309. Multiplexer 309 receives the mode bit M 108 from input buffer 302 and selects the output of XOR 305 (i.e. C2+P2+P3) as S3 if M=1, or alternatively selects the output of XOR 308 (C3+P3) as S3 if M=0.

As previously noted, the syndrome vectors 115 merely detect the presence of errors within the 72 bit word. If any of the syndrome bits are non-zero, the syndrome bit generation unit 114 has detected the presence of erroneous bit(s) within the retrieved word. Once such an error has been detected, the location of the detected error is determined in the error location unit 116.

ERROR LOCATION OPERATION

Upon generation of the syndrome vectors 115 (comprising the syndrome bits) by the syndrome bit generation unit 114, the vectors S0–S3 are passed to the error location unit 116. The error location unit performs logic operations on the received syndrome vectors 115 to determine the precise location of the erroneous bit(s) within the word including the 72 bits DQ0–DQ71 and the check bits represented by check bit vectors C0–C2 or C0–C3. The result of the logic operations performed within the error location unit 116 for a 72 bit word containing bit error(s) is a so-called nibble error indicator 118 (NEI) which is a single bit, which may be set to a value of "1" to indicate which of the 18 nibbles of data (D0–D17) within the 72 bit word includes the error(s). By assigning an NEI 118 in the range of NEI 0–NEI 17 to correspond to the eighteen 4-bit data nibbles within the 72 bit data word, further operations may be performed by the error correction unit 119 to restore the identified 4-bit data nibble(s) within the 72 bit word to their original value.

In the 72 bit embodiment of the invention the logic operations performed by the error location unit 116 are as follows:

NEI 0=1 if S0=S2 and S2/=0
NEI 1=1 if S1=S3 and S3/=0
NEI 2=1 if S0=(T1)S2 and S2/=0
NEI 3=1 if S1=(T1)S3 and S3/=0
NEI 4=1 if S0=T2(S2) and S2/=0
NEI 5=1 if S1=(T2)S3 and S3/=0
NEI 6=1 if S0=(T3)S2 and S2/=0
NEI 7=1 if S1=(T3)S3 and S3/=0
NEI 8=1 if S0=(T4)S2 and S2/=0
NEI 9=1 if S1=(T4)S3 and S3/=0
NEI 10=1 if S0=(T5)S2 and S2/=0
NEI 11=1 if S1=(T5)S3 and S3/=0
NEI 12=1 if S0=(T6)S2 and S2/=0
NEI 13=1 if S1=(T6)S3 and S3/=0
NEI 14=1 if S0=(T7)S2 and S2/=0
NEI 15=1 if S1=(T7)S3 and S3/=0
NEI 16=1 if S0=(T8)S2 and S2/=0
NEI 17=1 if S1=(T8)S3 and S3/=0
NEI 18=1 if S2=S3=0 and S0/=0
NEI 19=1 if S2=S3=0 and S1/=0
NEI 20=1 if S0=S1=0 and S2/=0
NEI 21=1 if S0=S2=0 and S3/=0

From the foregoing it can be seen that upon the generation of a non-zero syndrome bit, the error location unit 116 performs a comparison between the syndrome vectors 115 (S0–S3) to narrow the location of the erroneous bit(s) to a single data nibble D0–D17 within the 72 bit word. NEI 18–NEI 21 correspond to errors within the check bits and do not require further correction prior to passing the 72 bit word back to the computer system, however they are useful for the detection of uncorrectable errors as will be subsequently described.

Upon examination of the foregoing logical statements used in localizing an erroneous data nibble within the 72 bit word, it is readily apparent that the determination of the erroneous nibble(s) is performed via a two step process. First, we determine whether S2 or S3 are non-zero. This determination localizes the erroneous nibble to either D0, D2, ... D16 for S2/=0 or D1, D3, ... D17 for S3/=0. Next we attempt to equate the determined syndrome vector containing the non-zero value with the previously generated syndrome vector having the same data nibbles. For example, if S3 is a non-zero vector, we attempt to determine which data nibble therein is non-zero by comparing it with S1. If S3=S1 then we know that the data nibble D1 must contain the error since each of the other data nibbles in S1 is multiplied by one of the CBGs (T1–T8). Likewise, if S1=(T1)S3 we know that D3 must be the erroneous data nibble since D3 is multiplied by T1 in syndrome vector S1.

Inspection of the foregoing logical expressions additionally reveals the manner in which errors precipitated by entire DRAM failures in a 4 bit per chip or 8 bit per chip memory system may be detected and corrected in the present invention. Since the NEI's localize a 4-bit data nibble containing erroneous bit(s), the failure of a 4 bit per chip DRAM would toggle a single NEI. In an 8 bit per chip memory system each pair of adjacent data nibbles would represent a single DRAM. For example, D0 and D1 would be provided by a first DRAM chip whereas D2 and D3 would be provided by a second 8 bit per chip DRAM and so on. Since each successive NEI corresponds to alternating non-zero values in S2 (comprising the even data nibbles) and S3 (comprising the odd data nibbles), the toggling of adjacent NEIs (such as NEI 0 and NEI 1 or NEI 2 and NEI 3) would signal a chip failure for an eight bit per chip DRAM.

Figure 4:
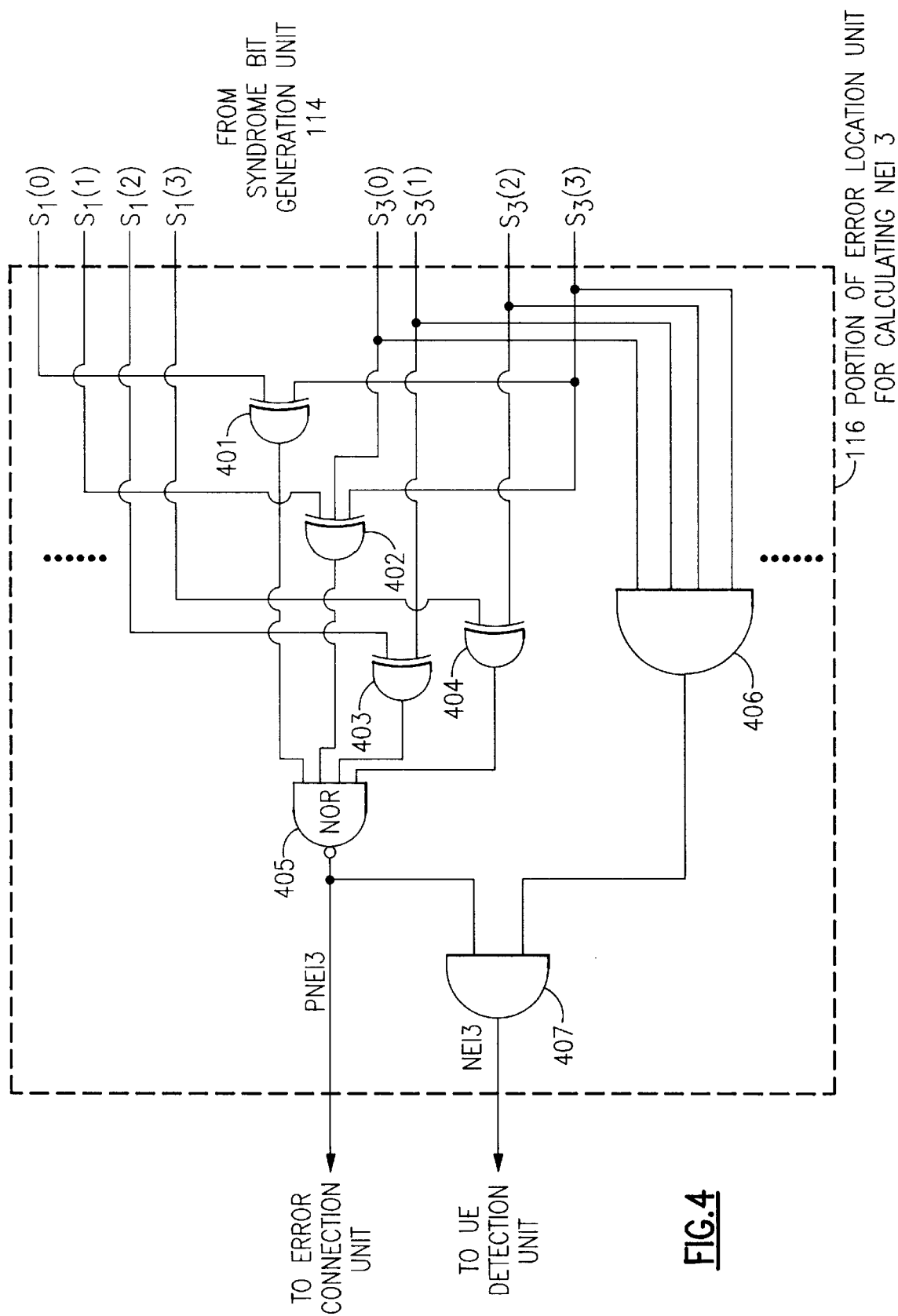
FIG. 4 illustrates a detailed functional view of the portion of the error location unit for nibble error indicator 3.

To better understand the logical function of the error location unit 116, reference may be had to FIG. 4 wherein an exemplary illustration of the operation of the error location unit for NEI 3 is presented. Since we have already noted that NEI 3=1 if S1=(T1)S3 and if S3/=0, we can readily provide the requisite logic to ascertain whether NEI 3 should be set to 1. The first step in ascertaining the state of NEI 3 involves determining if S1=(T1)S3. Since we have previously provided the T1 matrix and since we know that S3 comprises S3(0), S3(1), S3(2) and S3(3) we can see that the combination (T1)S3 yields:

$$\begin{vmatrix} 0 & 0 & 0 & 1 \\ 1 & 0 & 0 & 1 \\ 0 & 1 & 0 & 0 \\ 0 & 0 & 1 & 0 \end{vmatrix} * \begin{vmatrix} S3(0) \\ S3(1) \\ S3(2) \\ S3(3) \end{vmatrix} = \begin{vmatrix} S3(3) \\ S3(0) \\ S3(1) \\ S3(2) \end{vmatrix} + S3(3)$$

Additionally, since we know that if S1=(T1)S3, then S1+(T1)S3=0, we also know that if:

$$\begin{vmatrix} S1(0) \\ S1(1) \\ S1(2) \\ S1(3) \end{vmatrix} + \begin{vmatrix} S3(3) \\ S3(0) \\ S3(1) \\ S3(2) \end{vmatrix} + S3(3) = \begin{vmatrix} 0 \\ 0 \\ 0 \\ 0 \end{vmatrix}$$

then NEI 3=1. Thus, we may view in FIG. 4 the portion of the error location unit 116 which performs the logical function for NEI 3. Although the remaining logic for the entire error location unit is not illustrated for purposes of clarity, it will be readily apparent that the same types of logic operations are performed for each of the foregoing logical expressions to determine the state of each of the NEIs.

In FIG. 4, the syndrome bits corresponding to syndrome vectors S0 and S3 115 are received at the error location unit 116. The syndrome bits S1(0) and S3(3) are combined in XOR gate 401, the syndrome bits S1(1) and S3(0) and S3(3) are combined in XOR gate 402, the syndrome bits S1(2) and S3(1) are combined in XOR gate 403 and syndrome bits S1(3) and S3(2) are combined in XOR gate 404. To ensure that each of these XOR operations yields logical 0, the outputs of these XOR gates are input to NOR gate 405 which has an output which we shall designate as PNEI 3. The output of NOR gate 405 PNEI 3 should be equal to 1 if S1=(T1)S3 (i.e. if all of the inputs thereto are equal to 0). The PNEI 3 signal is output from the error location unit 116 for use by the error correction unit 119.

In the next operation it is determined that S3/=0. Each of the syndrome bits comprising vector S3 (i.e. S3(0), S3(1), S3(2) and S3(3)) are combined in OR gate 406. The output of this OR gate will be a "1" if any of the syndrome bits S3(0)–S3(3) are equal to 1.

Finally, the output of NOR gate 405 PNEI 3 and OR gate 406 are combined in AND gate 407. As we have noted, both of these outputs should be equal to "1" if the conditions S1=(T1)S3 and S3/=0 are true, accordingly, NEI 3 is the output of the AND gate 407, which, if equal to 1, represents a single or multiple bit error in the 3rd data nibble D3 of the 72 bit word (i.e. DQ12–DQ15). This NEI 3 signal is passed along to the uncorrectable error (UE) detection unit 117 for ascertaining whether the error detected by the syndrome bit generation unit 114 is uncorrectable. As noted earlier, the PNEI 3 signal is provided to the error correction unit 119 which will begin correction operations on the corresponding data nibble (D3) if PNEI 3=1, however, if S3=0 NEI 3 will equal 0 corresponding to an uncorrectable error which will be detected by the UE detection unit 117. The operation of the UE detection unit 117 and the error correction unit 119 will be subsequently discussed in detail.

Error Correction Operation

The PNEI signals generated at the error location unit 116 are passed to the error correction unit 119. The PNEIs identify to the error correction unit 119, which of the eighteen 4-bit data nibbles D0–D17 may include the erroneous bit(s). The error correction unit, upon receiving the PNEIs performs logic operations upon the identified data nibbles to restore the original bit values thereto.

For illustrative purposes we will continue to consider the foregoing example wherein PNEI 3=1 was generated by the error location unit 116. In accordance with the foregoing example we know that when PNEI 3=1 an error with respect to data nibble 3 (i.e. D3) comprising data bits 8–12 has been located. Further examination of the operation of the error location unit 116 reveals that the generation of the "1" value for PNEI 3 required that the syndrome vector S1 was equal to the product of check bit generation matrix T1 combined (in an AND operation) with syndrome vector S3. As previously noted, this condition specifically localizes the erroneous bit(s) within the fourth data nibble (D3), which would appear as non-zero values within the S3 syndrome vector 115. The location(s) of these non-zero value(s) represent the bit location(s) that have changed between the 72 bit word that was originally stored in the memory chips 102 and those that were subsequently retrieved therefrom. Thus, for example if D3 in the original 72 bit word was equal to (1011) and when retrieved was equal to (1001), the resultant S3 vector (assuming no other errors) would be:

$$S3=0000+0010+0000+0000+0000+0000+0000+0000+0000=0010$$

Accordingly, since the S3 vector identifies the position wherein the stored and retrieved data nibbles differ it follows that by performing an exclusive OR operation between the retrieved data nibble and S3 we will regenerate the original value of the stored data nibbles, for example:

$$S3+D3 \text{ (retrieved)}=D3 \text{ (stored) } (0010)+(1001)=(1011)$$

Applying the same analysis to the foregoing set of logical expression for generating the PNEIs we may generate nibble error patterns (NEPs) which may be XORed with the retrieved erroneous data nibble to restore the originally stored value of the nibble.

The list of NEPs corresponding to the foregoing PNEIs is as follows:

If PNEI 0=1 then NEP 0=S2
If PNEI 1=1 then NEP 1=S3
If PNEI 2=1 then NEP 2=S2
If PNEI 3=1 then NEP 3=S3
If PNEI 4=1 then NEP 4=S2
If PNEI 5=1 then NEP 5=S3
If PNEI 6=1 then NEP 6=S2
If PNEI 7=1 then NEP 7=S3
If PNEI 8=1 then NEP 8=S2
If PNEI 9=1 then NEP 9=S3
If PNEI 10=1 then NEP 10=S2
If PNEI 11=1 then NEP 11=S3
If PNEI 12=1 then NEP 12=S2
If PNEI 13=1 then NEP 13=S3
If PNEI 14=1 then NEP 14=S2
If PNEI 15=1 then NEP 15=S3
If PNEI 16=1 then NEP 16=S2
If PNEI 17=1 then NEP 17=S3

Figure 5:
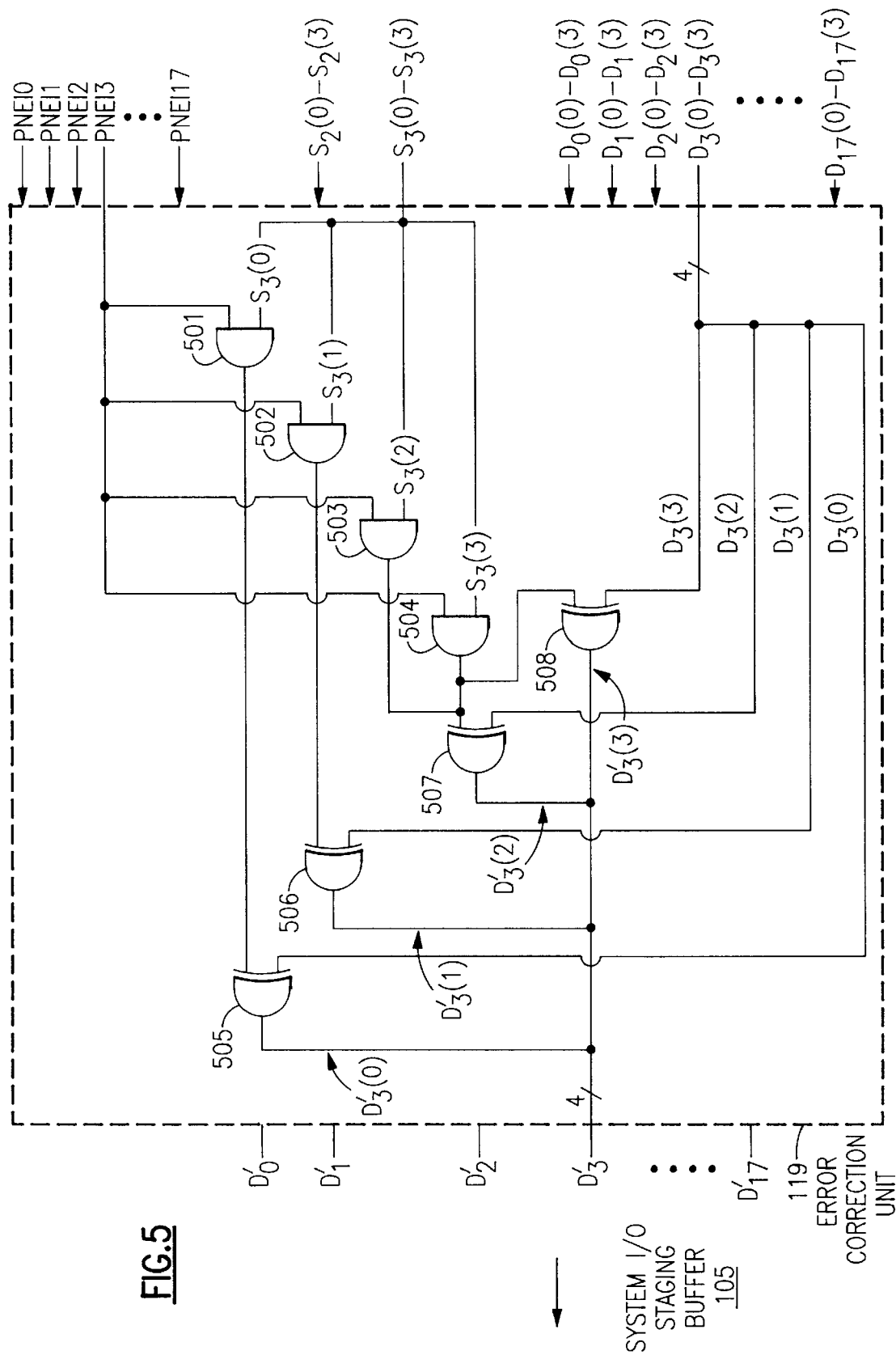
FIG. 5 illustrates a detailed functional view of the error correction unit.

The foregoing logical expressions are implemented within the error correction unit 119. The operation of the error correction unit is detailed in FIG. 5, which for purposes of clarity only shows the logical operation of error correction for data nibble D3. It will be understood that the same type of logic is applied to each data nibble in accordance with the foregoing expressions to accomplish data correction for each of the eighteen data nibbles. The error correction unit 119 receives the PNEIs from the error location unit 116, it receives the syndrome vectors S2 and S3 from the syndrome bit generation unit 114 and the 72 bit word (comprising 4-bit data nibbles D0–D17) from the memory I/O staging buffer 112.

In the illustrated example we follow the logic for performing data correction to data nibble D3. Each of the bits comprising the syndrome vector S3 (i.e. S3(0), S3(1), S3(2) and S3(3)) are combined in separate AND gates (AND gates 501–504) with the PNEI 3 bit from the error location unit 116. Assuming that the PNEI 3 bit has been set to "1" by the previously described operations within the error location unit 116, the original values of the syndrome bits (S3(0)–S3 (3)) are output from AND gates 501–504. These outputs are in turn combined in XOR gates 505–508 with the corresponding bits comprising the data nibble D3, such that S3(0) and D3(0) are combined in XOR gate 505, S3(1) and D3(1) are combined in XOR gate 506, S3(2) and D3(2) are combined in XOR gate 507 and S3(3) and D3(3) are combined in XOR gate 508. The corrected 4-bit data nibble output D'3(3) includes corrected bits D'3(0), D'3(1), D'3(2) and D'3(3). It may be observed in FIG. 5 that when PNEI 3=0 corresponding to the determination that D3 includes no errors, the output of the AND gates 501–504 is a set of "0"'s. When this output is combined in XOR gates 505–508 with D3(0)–D3(3) respectively, the value of the resultant bits D'3(0)–D'3(3) are equal to the value of the original data nibble D3 (i.e D3(0)–D3(3)). Thus, error correction is limited to those data nibbles identified as containing errors by the PNEIs.

After the error correction unit 119 has performed the requisite operations, the corrected 72 bit word comprising 4-bit data nibbles D'0–D'17 is passed along to the system I/O staging buffer 105 which in turn passes the corrected word onto the system data bus 104 for use by the computer system.

UE Detection Operation

As previously noted, certain type of errors are not capable of correction within the scope of the described embodiment. In particular, the present invention is directed toward providing error detection and correction for single and multiple bit errors up to entire DRAM chip failures for systems having either 4 bit per chip DRAMs or 8 bit per chip DRAMs. Accordingly, errors occurring to a single bit or to multiple bits within a single memory chip may be detected and corrected via the foregoing ECC system. In a four bit per chip DRAM, the 1–4 data bits which may be in error therein may be highlighted by toggling a single NEI. In keeping with our foregoing example, if NEI 3=1 this indicates that 1–4 bits within the 4-bit nibble D3 may be in error. In a four bit per chip system NEI 3=1 may therefore cover the case in which the entire DRAM chip storing the D3 nibble has failed.

Likewise, in an 8 bit per chip memory system, a single bit error or multiple bit error(s) including the case in which all eight bits in a DRAM are in error may be detected and corrected. Thus, for example, if both NEI 2=1 and NEI 3=1 this indicates that there are erroneous bits within the first and second 4 bit nibbles within an 8 bit per chip DRAM. It can therefore ben seen that the present inventive ECC system may provide error detection and correction for multiple bit errors including entire DRAM chip failures in a 4 bit per chip or 8 bit per chip memory system.

If errors occur within multiple memory chips which include more than one data nibble from the set D0, D2, D4 . . . D16 or the set D1, D3, D5 . . . D17, the errors may be uncorrectable within the scope of the present inventive ECC system, however, the system includes a mechanism for alerting the computer system of the error condition, and as such is capable of providing error detection for such situations. Moreover, as previously noted, broader error correction may be provided within the scope of the present invention via the use of additional check bits, however the storage of such longer check bits along with the 72 bit word may well prove cost prohibitive.

In order to better understand the operation of the UE detection unit 117, it will be instructive to first consider the types of errors that may be considered uncorrectable. The primary condition that triggers UE detection is the generation of non-zero syndrome bits, corresponding to the determination of an error condition in the retrieved word. As a preliminary matter it is necessary to define certain logic expressions which will serve to simplify our analysis of the UE detection operation. First, UE 1 will be set equal to the XOR of each adjacent pair of NEIs combined in an OR operation as:

UE 1=(NEI 0+NEI 1) OR (NEI 2+NEI 3) OR (NEI 4+NEI 5) OR . . . OR (NEI 20+NEI 21).

This expression presents a comparison between the error states of adjacent data nibbles (i.e. D0 and D1 etc.). Next UE 2 will be set to the combination of each of the even numbered NEIs in an OR operation as:

UE 2=NEI 0 OR NEI 2 OR NEI 4 OR NEI 6 OR . . . OR NEI 20.

This expression corresponds to the error states of the even numbered data nibbles. Finally, UE 3 will be set to the combination of each of the odd numbered NEIs in an OR operation as:

UE 3=NEI 1 OR NEI 3 OR NEI 5 OR NEI 7 OR . . . OR NEI 21.

This expression corresponds to the error states of the odd numbered data nibbles.

The simplest case of an uncorrectable error occurs when one or more of the syndrome vectors 115 (S0–S3) includes at least one non-zero bit, however none of the NEIs has toggled to zero. As such, where S0–S3/=0, the expression:

(NEI 0=NEI 1=NEI 2= . . . =NEI 21=0)

if true, corresponds to an error detected within one of the data nibbles (D0–D17) or within the check bit nibbles (C0–C2 or C0–C3) by the syndrome bit generation unit 114, which could not be localized by the error location unit 116. Since the error cannot be localized it follows that it cannot be corrected by the error correction unit 119, and as such an uncorrectable error has been detected.

As previously noted, multiple data nibble errors among the even numbered data nibbles (D0, D2 . . . D16) or among the odd data nibbles (D1, D3, . . . D17) in an 8 bit per chip DRAM corresponds to errors in more than a single DRAM which are not correctable. Thus, the expression:

(/M)(UE 1)(UE 2)(UE 3)

if equal to "1" corresponds to an error occurring in nonconsecutive even and odd data nibbles in an 8 bit per chip memory system (i.e. an error in more than one DRAM chip) which is uncorrectable in the present invention.

In systems having 8 bit per chip DRAMs an error which is represented by a "1" value for one of the even numbered NEIs corresponds to an error in one of the even numbered data nibbles (i.e. D0, D2, . . . , D16), thus if NEI 0, NEI 2, NEI 20=0 and S0 or S2 do not equal zero an uncorrectable error has occurred, which is covered by the logical expression:

(/M)(/(UE 2)((S0/=0) OR (S2/=0))

If the foregoing expression equals "1", then although either the S0 or S2 syndrome vectors or both include at least one "1" bit (as generated by the syndrome bit generation unit 114) denoting the presence of an error in one of the even numbered data nibbles (i.e. D0, D2, . . . D16), the even numbered NEIs (i.e. NEI 0, NEI 2, . . . , NEI 20) are all equal to "0" indicating that no such error has been located for correction by the error location unit 116. Accordingly, the unlocated error is uncorrectable. Likewise, in systems having 8 bit per chip DRAMs an error which is represented by a "1" value for one of the odd numbered NEIs corresponds to an error in one of the odd numbered data nibbles (i.e. D1, D3, . . . , D17), thus if NEI 1, NEI 3, . . . , NEI 21=0 and S1 or S3 do not equal zero an uncorrectable error has occurred, which is covered by the logical expression:

(/M)(/(UE 3)( (S1/=0) OR (S3 /=0))

If the foregoing expression equals "1", then although either the S1 or S3 syndrome vectors or both include at least one "1" bit (as generated by the syndrome bit generation unit 114) denoting the presence of an error in one of the odd numbered data nibbles (i.e. D1, D3, . . . D17), the odd numbered NEIs (i.e. NEI 1, NEI 3, . . . , NEI 21) are all equal to "0" indicating that no such error has been located for correction by the error location unit 116. Since the error cannot be localized it follows that it cannot be corrected.

Finally, in a system having 4 bit per chip DRAMs, for an error to be correctable, it must be detected in either syndrome bits included in syndrome vectors S0 or S1. In a 4 bit per chip system, an error detected via syndrome bits within both the S0 and S1 vector corresponds to a multiple DRAM failure which is considered uncorrectable within the foregoing description of the preferred embodiment of the invention. Accordingly, if the syndrome vectors S0 and S1 both include non-zero syndrome bits in a 4 bit per chip system, the expression:

(M)(S0 not zero)(S1 not zero)

will be equal to a logical value of "1" corresponding to an uncorrectable error.

Combining each of the foregoing logical expressions for detection of uncorrectable errors in the inventive ECC system yields the expression:

UE=(Syndrome bits not all equal to zero) AND to (((/M)(UE 1)(UE 2)(UE 3) OR (NEI 0=NEI 1=NEI 2=.=NEI 21=0) OR (/M)(/UE 2)( (S0 not zero) OR (S2 not zero) ) OR (/M)(/UE 3)( (S1 not zero) OR (S3 not zero) ) OR (M)(S0 not zero)(S1 not zero)

which is carried out within the UE detection unit 117.

Figure 6:
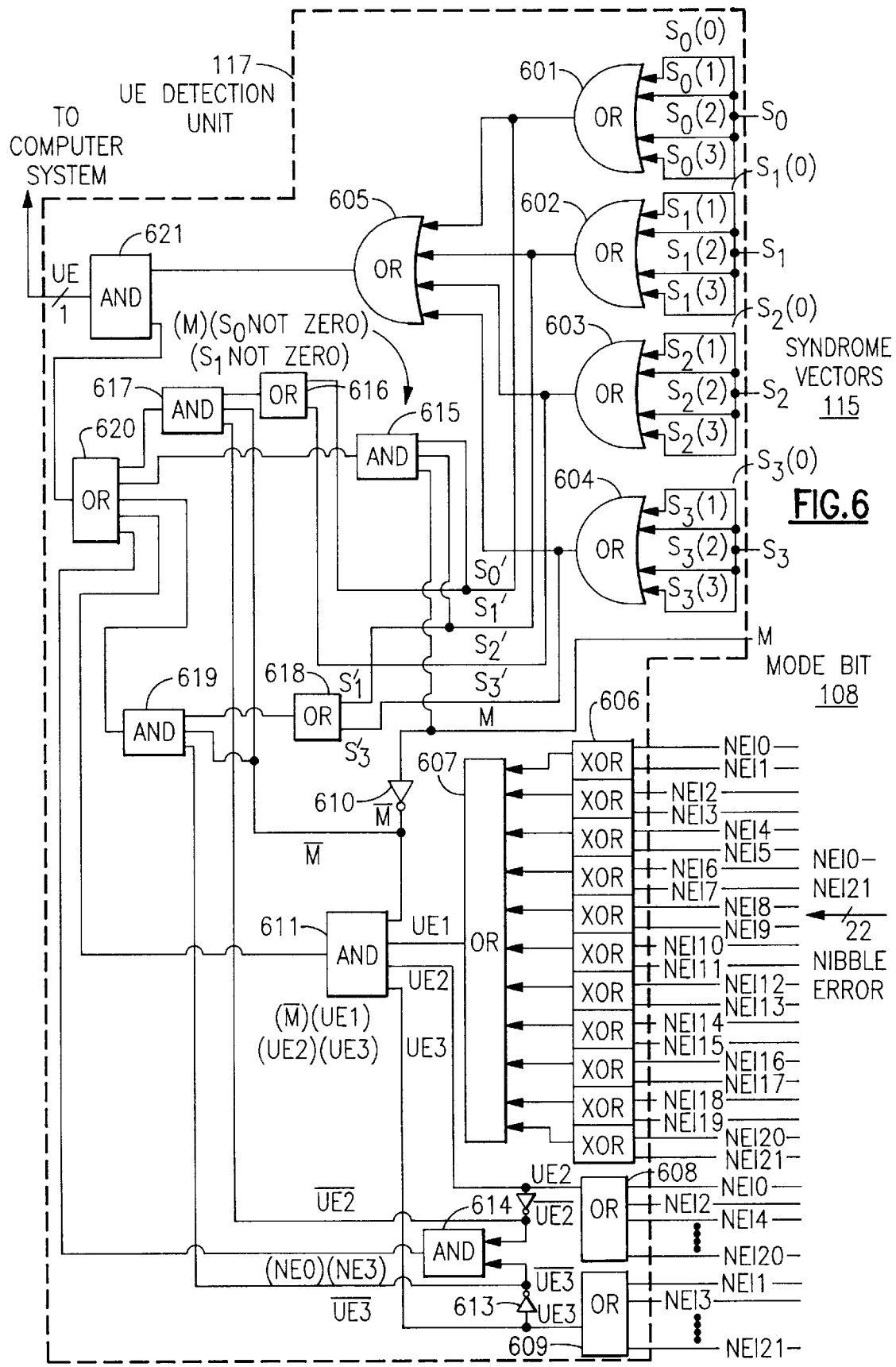
FIG. 6 shows a detailed functional view of the UE detection unit.

Referring now to FIG. 6, the foregoing logical expression is depicted as a set of logical operations carried out within the UE detection unit 117. The syndrome vectors S0–S3 are received from the syndrome bit generation unit 114 and the bits comprising each vector are combined in 4 OR gates (601–604), for example, for the S0 syndrome vector S0(0), S0(1), S0(2) and S0(3) are combined in OR gate 601 such that the output from each of these OR gates will be "0" if each syndrome bit equals "0" or "1" if any of the syndrome bits equal "1". The four outputs from OR gates 601–604 are in turn input into OR gate 605 which will output a "0" only if all of the syndrome bits are equal to "0". Alternatively, if any of the 16 syndrome bits are equal to "1" the output from OR gate 605 will be a "1".

The logic operations for generating UE 1 are performed in XOR gates 606 which respectively combine the NEI bits NEI 0 XOR NEI 1, NEI 2 XOR NEI 3, and so forth for all 22 NEI bits which are received at the UE detection unit 117 from the error location unit 116. The outputs from XOR gates 606 are input to OR gate 607 which in turn outputs UE 1.

UE 2 is generated by combining NEI 0, NEI 2, NEI 4, . . . , NEI 20 in OR gate 608 and UE 3 is generated via the combination of NEI 1, NEI 3, NEI 5, . . . , NEI 21 in OR gate 609.

The mode bit M 108 is received at the UE detection unit 117 from the ASIC receiver 109. The mode bit is passed through inverter 610 and input along with UE 1, UE 2 and UE 3 to AND gate 611 to realize the expression: (/M)(UE 1)(UE 2)(UE 3) as an output therefrom.

The expression (NEI 0=NEI 1=NEI 2=NEI 3 . . . =NEI 21=0) requires that a logical "1" be generated if every one of the NEIs equals 0. This expression is realized by first inverting UE 2 through inverter 612 and inverting UE 3 through inverter 613 and then by combining (/UE 2) and (/UE 3) in AND gate 614 to yield: (/UE 2)(/UE 3), which will equal "1" only if all of the NEIs equal "0".

To generate the expression (M)(S0 not zero)(S1 not zero) each bit comprising the syndrome vectors S0 and S1 are combined in two OR operations 601 and 602, such that S0(0), S0(1), S0(2) and S0(3) are combined in a first OR gate to give a 1 bit product of S0 (which will be "1" if S0 is not all zeros) and the same is done for S1. The output of these two OR operations are then passed through AND gate 615 along with the mode bit 108 to realize the foregoing expression.

To generate the expression (/M)(/UE 2)((S0 not zero) or (S2 not zero)), the four syndrome bits comprising S0 and the four syndrome bits comprising S2 are each input into two 4 input OR gates (601 and 603 respectively) so as to output a "1" if any of the syndrome bits therein are equal to "1". The outputs of 601 and 603 are combined in OR gate 616, which has its output combined in AND gate 617 with /M and /UE 2 to realize the foregoing expression. Likewise, to realize the expression (/M)(/UE 3)((S1 not zero) or (S3 not zero)), the four syndrome bits comprising S1 and the four syndrome bits comprising S3 are each input into two 4 input OR gates (602 and 604 respectively) so as to output a "1" if any of the syndrome bits therein are equal to "1". The outputs of 602 and 604 are combined in OR gate 618, which has its output combined in AND gate 619 with /M and /UE 3.

Finally each of the foregoing expressions is combined in OR gate 620, which in turn has its output combined with the output of OR 605 (which is "1" if any of the syndrome bits are equal to "1") in AND gate 621 which outputs the UE detection bit to the computer system for use by the existing error correction logic therein.

As noted previously, if the UE bit were to be provided to the error correction unit 119 to stop the correction of errors therein, it is possible that the UE bit may be received at the error correction unit 119 after the error correction unit has begun attempting to correct detected errors in the 72 bit word (after receipt of the PNEI bits) and could hold up the passage of the uncorrectable word to the computer system. Such an implementation would, however, require buffering of the 72 bit word at the error correction unit 119 in order to allow the UE detection operation to complete and signal the error correction unit prior to allowing the 72 bit word to pass through the system I/O staging buffer 105 on to the data bus 104 of the computer system. This buffering of every 72 bit word in order to catch the relatively few words including uncorrectable errors would create unnecessary system inefficiencies. Accordingly, in the preferred embodiment of the invention, the UE detection signal is passed directly to the error control logic previously existing on the computer system to signal the presence of a data word including uncorrected bits of data.

Figure 7:
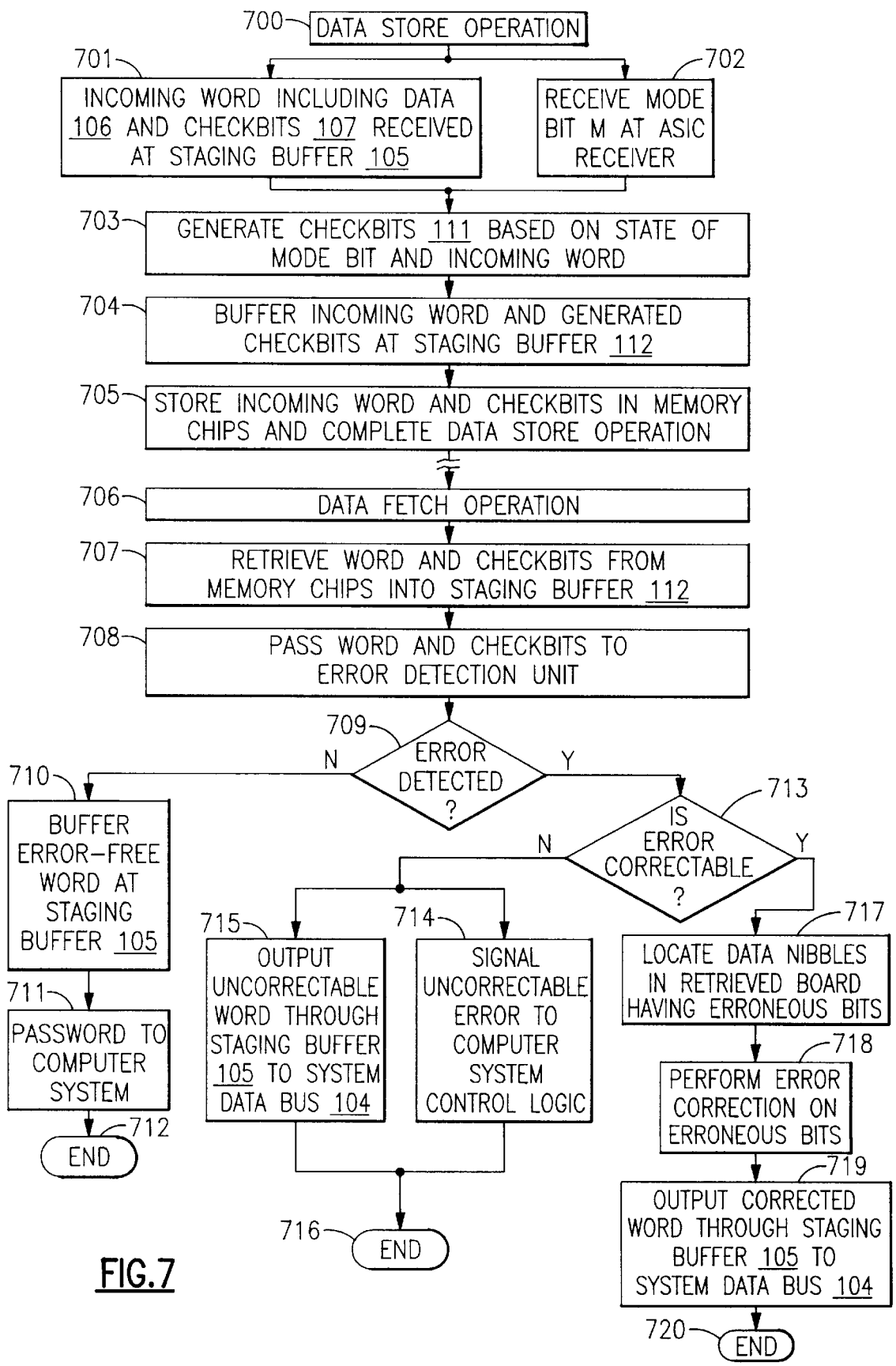
FIG. 7 depicts a flow diagram generally encompassing the steps of the inventive ECC process.

To better understand how each of the previously described functional components interoperate in the present invention reference may be had to FIG. 7 wherein a flow diagram for the inventive ECC process is shown.

Starting with the execution of a data storage operation 700 by the computer system such as the execution of a write operation, the incoming 72 bit word, which includes both data bits 106 and check bits 107 which were generated via the pre-existing error control scheme for the computer system are received in the system I/O staging buffer 105 in step 701. The state of the mode bit M 108 is concurrently read by the ASIC receiver 109 in step 702. The mode bit M and the 72 bit word are both received at the check bit generation circuit 110 which generates check bits 111 as previously described for the received 72 bit word based upon the values of the received bits DQ0–DQ 71 (vectors D0–D17) and the mode bit M 108, in step 703. Upon generation of the check bits 111 by the check bit generation circuit, the 72 bit word along with the appended 12 or 16 check bits 111 (depending on the memory chips used on the DIMM as indicated by the state of the mode bit M) are buffered in the memory I/O staging buffer 112 for subsequent storage in the memory chips 102 in step 704. Thereafter the buffered 72 bit word and check bits 111 are stored in the memory chips 102 ending the data store operation at step 705.

When the computer system executes a data fetch operation, such as a memory read operation, which requires the retrieval of the previously stored 72 bit word in step 706, the stored word and check bits 111 are retrieved from the memory chips 102 into the memory I/O staging buffer 112 in step 707. In step 708 the retrieved word and check bits are passed to the error detection unit 113 comprising the syndrome bit generation unit 114, the error location unit 116 and the UE detection unit 117. If the error detection unit 113 detects an error within the retrieved word the "yes" branch of the decision point at step 709 is traversed. Alternatively, if no error is detected by the error detection unit 113, the no branch of decision point 709 is followed.

Assuming that no errors are detected by the error detection unit 113 at decision point 709, the process proceeds to step 710 wherein the correct retrieved word is buffered at the system I/O staging buffer 105. Finally, at step 711 the buffered word is passed onto the computer system data bus 104 completing the data fetch operation 712.

If errors within the retrieved word are detected in the error detection unit 113 at decision point 709, the process continues to decision point 713 wherein the UE detection unit 117 determines whether the errors are correctable. If the errors that have been detected are determined to be uncorrectable for any of the foregoing reasons, the no branch of decision point 713 is traversed. The UE detection unit signals the UE condition at step 714 which is passed to the computer system error control logic and the uncorrected (and uncorrectable) word is concurrently passed to the computer system data bus 104 through the system I/O staging buffer 105 at step 715 thereby ending the data fetch operation 716.

If the error that has been detected at decision point 709 is a correctable error within the context of the present inventive ECC, the yes branch of decision point 713 is traversed to step 717 wherein the data nibble(s) containing the erroneous bits are located by the error location unit 116. Once the erroneous bits are localized to a data nibble (or two nibbles in the case of an 8 bit per chip DRAM) these locations are passed to the error correction unit 119, which corrects the erroneous data nibbles 718 and passes the corrected word through the system I/O staging buffer 105 to the computer system data bus 104 in step 719 thereby completing the data fetch operation 720.

Figure 8:
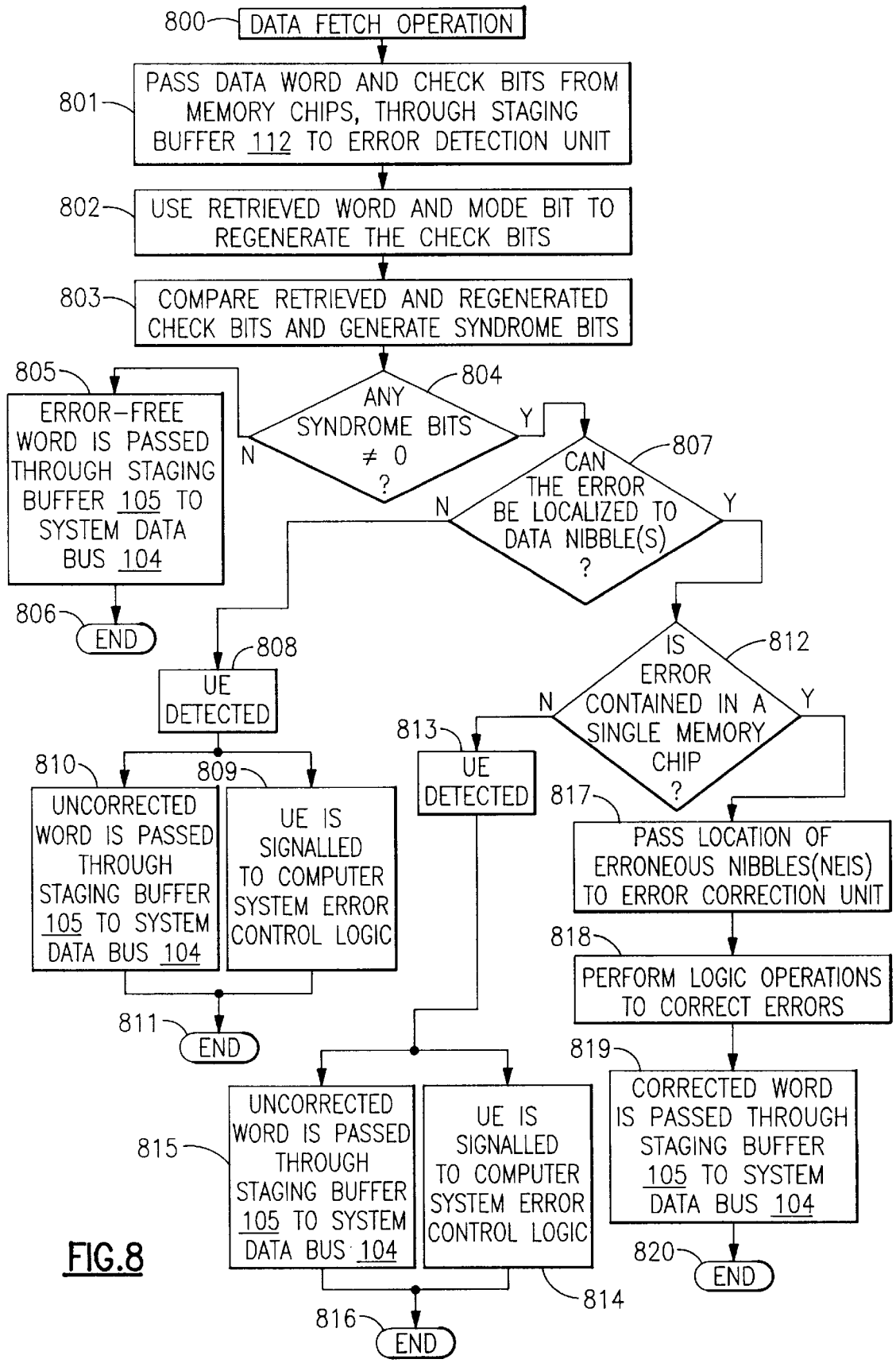
FIG. 8 illustrates a detailed flow diagram for the error detection, correction and the UE detection processes.

To better appreciate the error detection and correction process including the generation of the UE detection signal we now turn to the flow diagram illustrated in FIG. 8 which provides a more detailed view of the logical flow for these operations.

Starting with the initial execution of a data fetch operation in step 800, the computer system causes the memory chips 102 including the 72 bit word (which includes data bits 106 and check bits 107) along with the previously generated and stored check bits 111 to be passed through the memory I/O staging buffer 112 to the error detection unit 801. Within the error detection unit, the syndrome bit generation unit 114 uses the retrieved 72 bit word along with the current state of the mode bit 108 to regenerate check bits in step 802. thereafter, in step 803 the retrieved check bits 111 and regenerated check bits are compared in the syndrome bit generation unit 114 to generate the syndrome bits 115.

At decision point 804 it is determined in the error location unit 116 whether any of the syndrome bits 115 are non-zero. If none of the syndrome bits are non-zero, the retrieved data word is identical to the stored data word, and accordingly it is not in need of correction. Thus, at step 805 the error-free word is passed through the system I/O staging buffer 105 back to the computer system data bus 104 thereby ending the data fetch operation 806.

If the error location unit 116 determines that the syndrome bits are not all non-zero, the process traverses the yes branch of decision point 804 to decision point 807 wherein it is determined whether the erroneous bits within the retrieved word can be localized by the error location unit 116.

If no localizing of the errors can be accomplished (i.e. if none of the NEIs is toggled to "1") the error cannot be corrected, we therefore traverse the no branch of decision point 807 to step 808 wherein a UE is detected at the UE detection unit 117. The UE detection unit sets the UE signal at "1" in accordance with the foregoing and previously illustrated logic operations and the UE signal is passed to the previously existing error control logic for the computer system in step 809. Concurrently, the uncorrected (and uncorrectable) word is passed through the system I/O staging buffer 105 to the computer system data bus 104 in step 810 and the data fetch operation is ended 811.

If the error location unit 116 successfully localizes the erroneous bits to one or more of the data nibbles, the yes branch of decision point 807 is traversed to arrive at decision point 812. At decision point 812 we determine whether the localized erroneous bits reside within a single 4 bit per chip or 8 bit per chip DRAM. As we had previously noted each data nibble represents a different DRAM in a 4 bit per chip system while each successive pair of data nibbles represent a different DRAM in an 8 bit per chip system. Assuming that the error is located in more than one memory chip 102, we traverse the no branch of decision point 812 to step 813. Since the present ECC does not correct errors occurring in more than one memory chip the UE detection unit 117 toggles the UE bit to "1" 813 signalling an uncorrectable error to the computer system 814 error control logic. Concurrently, the uncorrected data word is passed to the computer system 815 and the data fetch operation is ended 816.

If the error can be localized within one DRAM in a 4 bit per chip or 8 bit per chip memory system, we traverse the yes branch of the decision point 812 to step 817. Since the error has been localized at the error location unit 116 we have successfully generated at least one non-zero NEI, the corresponding PNEI is passed in step 817 to the error correction unit 119, which upon receipt of the PNEIs for the correctable errors, performs the logic operations to correct the errors 818. Upon correction the data word is passed to the system I/O staging buffer 105 and in turn to the computer system data bus 104 in step 819, thereby ending the data fetch operation in step 820.

Many computer systems include as part of their native error control logic, some type of system error maintenance logic, or another corresponding strategy for tracking accumulating errors in accessed data words, so as to provide an indication to a system administrator, after a predetermined number of errors have accumulated, that some type of system maintenance (such as the replacement of a bad DRAM chip) must be performed. Consequently, in a further embodiment of the invention, the ECC system includes a mechanism for providing a notification to the original computer system to indicate that an error condition within an accessed data word has been corrected by the ECC logic 103. As has been previously described herein the ECC logic 103 functions by correcting single and multiple bit errors as well as by detecting uncorrectable errors in accessed data words in a manner that is not directly observable by the host computer system. Accordingly, in the absence of a mechanism for alerting the computer system upon the performance of an error correction operation by the ECC logic 103 to an accessed data word, the computer system could not utilize its system error maintenance logic with the attendant consequence that accumulating error conditions warranting a maintenance operation would not be made apparent to the user of the system until the system performance had been observably degraded.

Figure 9:
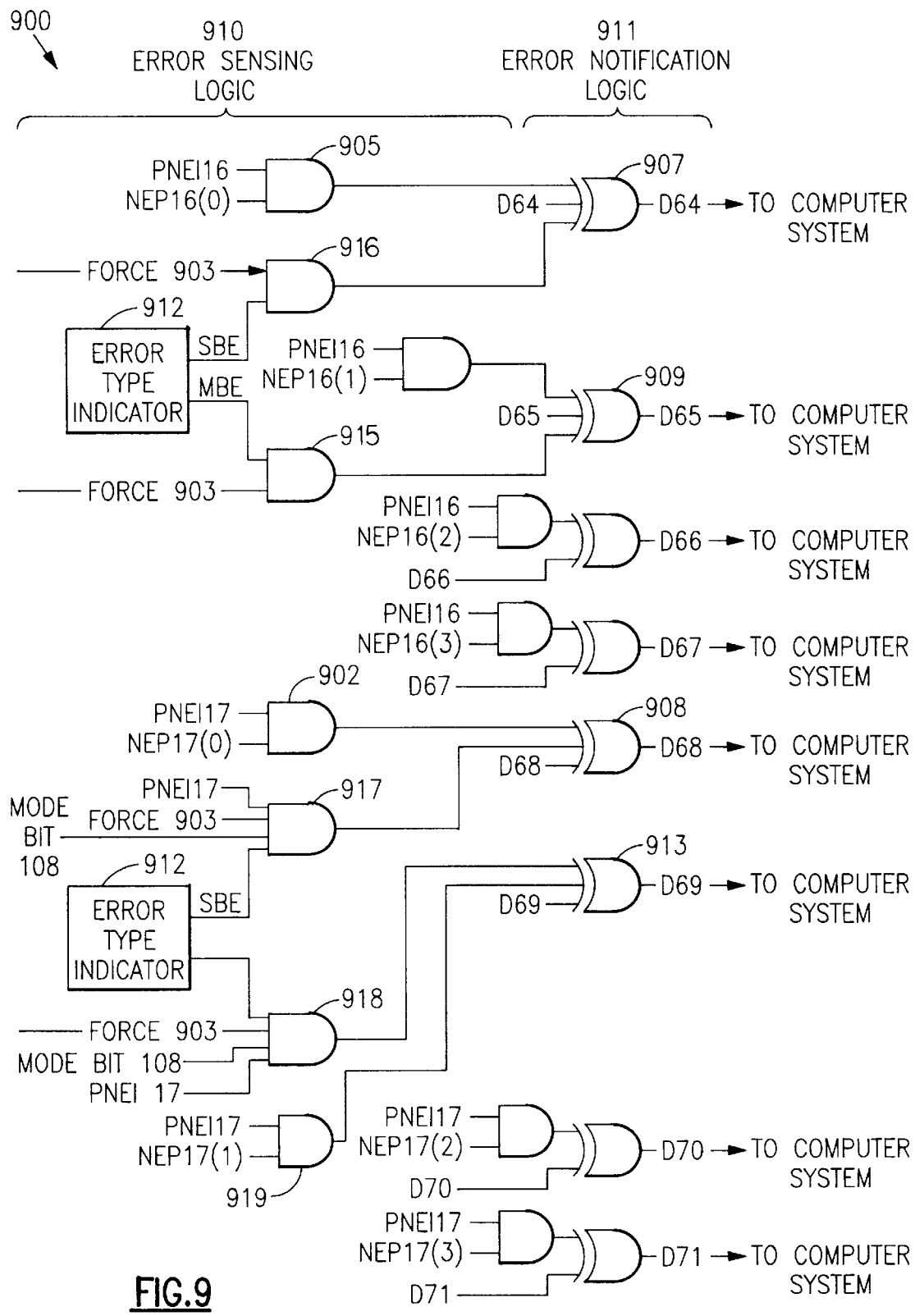
FIG. 9 depicts an error correction notification apparatus for alerting the computer system that an accessed data word has been corrected by the ECC logic.

In a preferred embodiment of the invention, error correction notification is performed by intentionally forcing a new error condition on a corrected accessed data word prior to transmitting the data word to the computer system. The new intentionally forced error will be of a type which the host computer system's error control logic is capable of detecting and correcting. For example, where the host computer system includes SEC DED error correcting code, the error correction notification would intentionally force a new single bit error onto the corrected data word by inverting the logic state of a predetermined bit (either a data bit or check bit) within the corrected data word before sending it downstream to the host computer. In this manner, the host computer system error maintenance logic will detect each error corrected by the ECC logic 103, and accordingly the error notification strategy of the host computer is enhanced in accordance with the ECC enhancements of the present invention. In light of the foregoing, error correction notification logic 900 which may be implemented in conjunction with the present inventive ECC logic 103, preferably within error correction unit 119 is depicted in FIG. 9. As illustrated, the error correction notification logic 900, which is illustrated for the byte including bits D64–D71 of the 72 bit data word and is replicated for each byte of the 72 bit data word, includes and error sensing logic 910 for sensing the occurrence of an error correction operation by the ECC logic 103. The error sensing logic 910 comprises the AND gates 905, 915, 916, 902, 917, 918 and 919, as illustrated. AND gates 901, 915 and 916 enable the error forcing function for memory systems having a "by 8" or "by 4" DRAM configuration whereas AND gate 902 along with AND gates 917–919 enable the error forcing function for memory systems having a "by 4" DRAM configuration. Each of the AND gates 915, 916, 917 and 918 receives the signal FORCE 903 which is the enabling signal to actuate this error notification function. In a preferred embodiment, this signal is provided to the ECC logic 103 via a pin on the ASIC such that the error notification mode may be conveniently enabled and disabled by the computer system user.

AND gates 917 and 918 additionally receive the mode bit 108 from the ASIC receiver 109. Since a logic "0" on the mode bit 108 indicates a "by 8" memory configuration, AND 917 and 918 represents the logic for forcing an error in a memory system having a "by 4" configuration. The nibble error indicator representing the 17th data nibble D68–D71 (i.e. PNEI 17) is coupled to the input of AND gates 902, 917 and 918. A logic "1" level on PNEI 17 indicates an error within the data nibble. Along with the PNEI 17 signal, the NEP 17 signal corresponding to the bit D68 (i.e. NEP 17(0)) is provided to gate 902 and the NEP 17 signal corresponding to data bit D69 (i.e. NEP 17(1) is provided to gate 918.

For the "by 8" implementation a predetermined bit (for example the first bit or D64) within the byte D64–D71 will be forced into its erroneous logic state to indicate an error in the byte which includes the bits represented by both PNEI 16 and PNEI 17. Accordingly, the PNEI 16 and the NEP 16 (0) signals are provided to AND gate 905. This bit NEP 16(0) indicates whether the data bit D64 is at its correct or incorrect logic level. If S2(0)="1" we know that D64 is already in error and need not be inverted whereas if S2(0)= "0", D64 is in its correct logic state and must be inverted if we are to pass along an error notification to the computer system.

The output of AND 905 is next provided to the error notification logic 911 comprising XOR gate 907 as an input along with the output of AND 916. AND 916 receives as input the output of error type indication logic 912 which will be subsequently depicted in detail in FIG. 10. Error type indicator logic outputs a "1" on the SBE line which is input to AND 916 when a single bit error is detected. In addition to the SBE line from 912, AND 916 also receives as input the force signal 903, thus where force is equal to "1" and a single bit error occurs, AND 916 outputs a "1" to XOR 907.

Finally, the data bit D64 is also provided from the memory chips 102 as an input to the XOR gate 907 which in turn outputs the logic state for data bit D64 for access by the computer system. Thus, we can see that where a single bit error occurs within the byte including D64–D71 in a "by 8" memory system with error notification enabled, the state of the D64 data bit is forced into (or maintained in) an incorrect logic state and sent to the computer system to notify the system of the correction operation by ECC logic 103. Likewise, where a single bit error is detected in a "by 4" implementation within data nibble D64–D67, the D64 data bit is also forced into (or maintained in) an incorrect logic state and sent to the computer system to notify the system of the correction operation by ECC logic 103.

In the case of a multiple bit error in a "by 8" implementation, the AND 915 receives as input the multiple bit error (MBE) output of error type indication logic which equals "1" when a multiple bit error is detected. AND 915 also receives as input the force bit 903. Thus, AND 915 will output a "1" where error forcing is enabled and where a multiple bit error is detected in the nibble D64–D67 in a "by 4" or in the byte D64–D71 in a "by 8" implementation. The output of AND 915 along with the state of data bit D65 are input to XOR 909 along with the output of the logical AND combination of PNEI 16 and NEP 16(1) which will be a "1" if there is an error in nibble D64–D67 and if the bit D65 is in its incorrect state. Thus, the output of D65 will be passed along to the computer system in its incorrect state if error forcing is enabled and a multiple bit error is detected.

For "by 4" memory configurations, each nibble of data represents a separate DRAM, and accordingly an error or errors in a data word will be identified within the data nibble containing the error(s). Thus for the 17th data nibble D68–D71 the AND gate 902 will output a logic "1" where the mode bit 108 is equal to "1" and where PNEI 17="1" signifying an error(s) in the 17th data nibble and NEP 17(0)="1" signifying that the bit D68 is in the incorrect state. The output of AND 902 is provided to the error notification logic 911 including XOR gate 908 as an input. In addition, AND gate 917 which receives the state of the force 903 bit as well as the SBE state from error type indicator 912 and the mode bit 108 will output a "1" to be input to XOR 908 where error forcing is on in a "by 4" implementation and where a single bit error has been detected. The data bit D68 is further input into XOR 908 such that it will pass through to the computer system in its incorrect state if a single bit error is detected in a "by 4" implementation.

For multiple bit errors occurring in a "by 4" configured system, the AND 918 receives as input the MBE line from the error type indicator 912 (which equals "1" where a multiple bit error is detected) the force bit 903, the mode bit 103 and the PNEI 17 signal so as to output a "1" where error forcing is enabled and a multiple bit error is detected in a "by 4" configured memory system in which an error has been detected in the nibble D68–D71. The AND gate 919 receives as inputs the PNEI 17 signal as well as the NEP 17(1) signal so as to output a "1" where an error is associated with the data nibble D68–D71 and where the value of the bit D69 (corresponding to the state of NEP 17(1)) is incorrect. The output of AND gates 918 and 919 are provided as input to XOR 913 along with the state of data bit D69. It can therefore be seen that in a "by 4" system having a multiple bit error correction the incorrect state of the data bit D69 is passed along to the computer system.

From the above description it will be readily appreciated that it is possible, via minor modifications to the existing gate level logic within the error correction unit 119, to enable error correction notification by intentionally sending the incorrect logic state for a predetermined bit downstream to the host computer. The bits that are not used as predetermined bits for error notification purposes pass to the computer system through the previously illustrated logic path of error correction unit 119 wherein the data bit is combined in an AND gate with the corresponding PNEI bit and the output of the AND gate is coupled in an XOR gate with the corresponding NEP bit for the data bits (see D66–D67 and D70–D71 in FIG. 9). The host computer will in turn correct the intentional error and log the error correction.

As has been illustrated, the error notification circuitry is capable of passing detailed information on the presence and type of error correction operation to the host computer system. Likewise, it would be a trivial matter to simply pass along an intentionally incorrect bits (i.e. bit 0 in each byte or nibble depending upon the memory configuration) to indicate that some type of error correction operation has taken place or alternatively to use further bit positions to provide more information on the type of error correction operation that has taken place (i.e. single bit or double bit or triple bit etc.). Each of these embodiments would require a trivial modification of the depicted logic and are contemplated as being within the scope of the present invention.

It will be understood, of course, that modifications to the host computer system's error control microcode will be required to decode the encoded error notification signal, so as to separately record (for example via separate threshold counters) the occurrence of single bit error correction operations, double bit error correction operations and so on. Such modifications to the error control logic would be a relatively simple matter for the skilled artisan and as such no further explanation is required herein.

As has been shown, the error notification logic may provide downstream notice to the computer system based upon the type of error correction that has taken place within the ECC logic 103. In our example the error types were divided in to single bit error correction and multiple bit error correction (although a more granular division is contemplated to be within the scope of this invention). In order to ascertain which type of correction operation has taken place the error type indication logic 912 was utilized. It will be recalled that the illustrated implementation of the error correction notification logic 900 utilized an error type indication logic 912 which produced a "1" on a single bit error (SEE) line when a single bit error correction operation had taken place and a "1" on a multiple bit error (MBE) line when a multiple bit error correction operation had taken place. The logic underlying the generation of the SBE and MBE signals will now be described via reference to FIG. 10.

Figure 10:
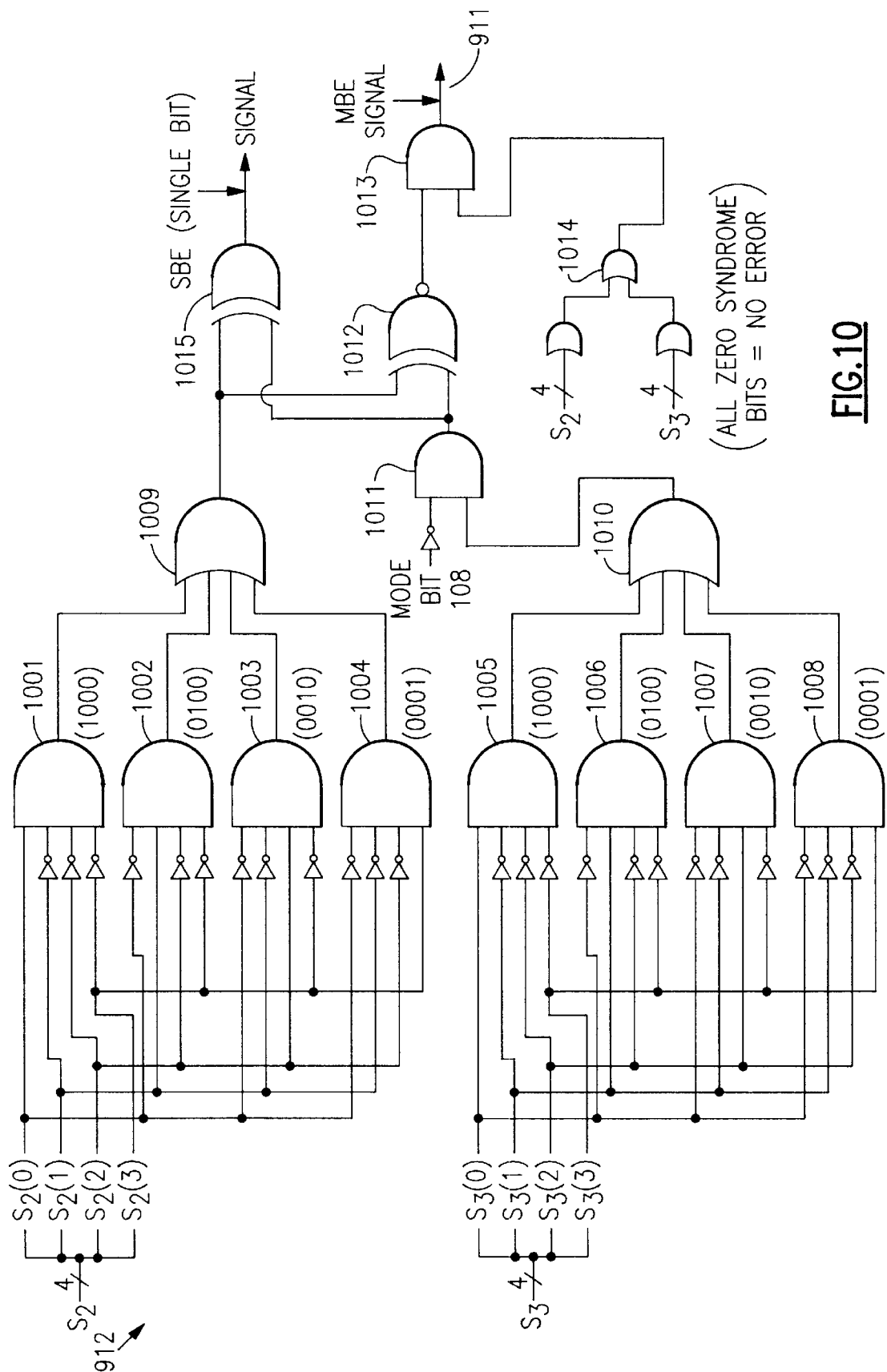
FIG. 10 illustrates exemplary error type indication logic for providing separate notification to the computer system for single bit error correction and multiple bit error correction operations.

Turning to the logic implementation of the error type indicator logic 912, we see in FIG. 10 that the determination of the type of error that is being corrected by the ECC logic 103 requires an examination of the NEP's which correspond to the bits comprising syndrome vectors S2 and S3.

Since each of the syndrome vectors is a four bit vector, there are four possible outcomes for each vector corresponding to a single bit error, namely: 1000, 0100, 0010, and 0001. these single error states are decoded by AND gates 1001–1008. The S2 vector (comprising bits S2(0) S2(3)) is provided as four bit inputs to AND gates 1001–1004 and the S3 vector is provided as four bit inputs to AND gates 1005–1008.

If the output of either subset of four AND gates (1001–1004 or 1005–1008) is a "1" as identified by the output of OR gates 1009 and 1010 respectively, there is a single bit error that is being corrected by the ECC. In a "by 4" system we are only concerned about the vector S2 for the predetermined bit (i.e D64), whereas in a "by 8" implementation we would look at the state of both S2 and S3 to determine whether to force an error on the predetermined bit. Thus, the inverted mode bit 108 is provided to AND gate 1011 along with the output of OR 1010 so as to either pass along the state of the single error detection AND gates (1005–1008) for a "by 8" implementation or a "0" for a "by 4" implementation.

The output of the AND 1011 and the OR 1009 are provided to both XOR 1015 for generating the SBE signal and to XNOR 1012 for generating the MBE signal, with the output of the S3 AND gates 1005–1008 equating to "don't care" status where the system is configured as a "by 4" memory system. The output of the XNOR 1012 is provided as input to the AND gate 1013 which additionally receives input from the OR gates 1014 which produce a logic "0" if none of the S2 and S3 bits are equal to "1" to indicate a no error condition or a "1" if any of the S2 and S3 bits are equal to "1".

Thus, we can see that where single bit errors occur on both the S2 and S3 vectors in a "by 8" configuration (in other words a multiple bit error) the error type indication logic produces a "1" on the MBE line. Additionally, if neither S2 or S3 show a single bit error but the OR gates 1014 indicate that a no error condition does not exist (i.e. 1014 outputs a "1") then the logic 912 outputs a "1" on the MBE line again indicating a multiple bit error.

In the case of a "by 4" implementation, the output of AND 1011 will always be "0". Moreover, in the case of "by 4" implementation the syndrome vector S2 will be identical to the syndrome vector S3. Thus, where a single bit error is indicated on S2 (and therefore on S3 as well) the XOR 1015 outputs a "1" on SBE. Alternatively, if a single bit error is not detected on S2, the XOR 1015 will output a "0" on SBE. Moreover, the AND 1013 will always produce a logic "0" on MBE when a single bit error is detected.

In this manner error notification may be provided to the computer system so as to distinguish the type of error correction operation being performed by providing separate notifications corresponding to the type of error correction done by the ECC logic 103.

Alternate implementations of the foregoing invention need not be limited to inclusion of the inventive ECC within a single computer system. For example, those skilled in the art will appreciate that the foregoing ECC could readily be implemented in two or more distinct communicating systems. The data encoding mechanism (i.e. the check bit generation) would occur as previously described within a system that is seeking to transmit data to another remote system (or systems) and the decoding mechanism, including error detection via syndrome bit generation, error location via nibble error indicator bit generation, UE detection and error correction would be implemented (in a manner that has been previously detailed) in the remote receiving system(s).

Though preferred embodiments have been depicted and described in detail herein, it will be apparent to those skilled in the relevant art, both now and in the future, that various modifications, additions, improvements and enhancements may be made without departing from the spirit of the invention, and these are therefore considered to be within the scope of the invention defined in the following claims, which should be construed so as to maintain the proper protection for the invention first disclosed.

Having thus described our invention in detail, what we claim as new and desire to protect by letters patent is as follows:

1. An apparatus for generating an error notification for indicating to a computer system that a data word accessed by said computer system has been corrected, said apparatus for use in conjunction with an error correction system wherein said accessed data word is corrected in a manner that is not directly observable by said computer system, said apparatus comprising:

a correction sensor which may be coupled to said error correction system for sensing that said accessed data word has been corrected by an error correction operation; and an error notification circuit coupled to said correction sensor for causing an error in one or more predetermined bits in the corrected accessed data word to be passed to said computer system wherein said error may be corrected and logged by said computer system.

2. An apparatus according to claim 1 wherein said error notification circuit ensures that the incorrect logic states of the one or more predetermined bits is passed to the computer system in said accessed data word if an error correction is sensed by said correction sensor.

3. An apparatus according to claim 1 wherein said error notification circuit includes logic for determining if the original logic states of the one or more predetermined bits are correct.

4. An apparatus according to claim 3 wherein said error notification circuit causes said errors to be passed to the computer system by inverting the logic states of said one or more predetermined bits if it is determined that the original logic states of said one or more predetermined bits are correct.

5. An apparatus according to claim 3 wherein said error notification circuit causes said errors to be passed to the computer system by maintaining the logic states of said one or more predetermined bits if it is determined that the original logic states of said one or more predetermined bits are incorrect.

6. An apparatus according to claim 5 wherein the logic states of the one or more predetermined bits are maintained by disabling the error correction operation for the one or more predetermined bits.

7. An apparatus according to claim 1 wherein said error correction system is capable of correcting any number of errors which may occur in a portion of said accessed data word wherein said portion is stored within a single memory chip and wherein said one or more predetermined bits are within the portion of the accessed data word stored within the single memory chip.

8. An apparatus according to claim 7 wherein the error notification circuit is capable of providing separate notifications to the computer system each corresponding to the number of errors corrected by said error correction system.

9. An apparatus according to claim 8 wherein the separate notifications are provided by causing the incorrect logic state of different ones of the one or more predetermined bits to be passed to the computer system wherein each of the different predetermined bits corresponds to the correction of a different number of errors.

10. An apparatus according to claim 1 wherein the error correction system may correct errors occurring to data stored in a set of memory chips having one of a plurality of different memory configurations and wherein said correction sensor ascertains the memory configuration of the plurality of memory chips and wherein the error notification circuit causes the errors on the appropriate one or more predetermined bits to be passed to the computer system depending upon the ascertained memory configuration.

11. A method for generating an error notification for indicating to a computer system that a data word accessed by said computer system has been corrected, said apparatus for use in conjunction with an error correction system wherein said accessed data word is corrected in a manner that is not directly observable by said computer system, said method comprising the steps of:

sensing an error correction operation performed by said error correction system upon said accessed data word; and causing an error in one or more predetermined bits in the corrected accessed data word to be passed to said computer system;

wherein said error may be corrected and logged by said computer system.

12. A method according to claim 11 wherein the causing of said errors step is performed to ensure that the incorrect logic states of the one or more predetermined bits is passed to the computer system if an error correction is sensed in said sensing step.

13. A method according to claim 11 wherein the step of causing the errors to be passed to the computer system further includes the step of determining if the one or more predetermined bits are in the correct logic states.

14. A method according to claim 13 further including the step of inverting the logic states of said one or more predetermined bits if it is determined that the original logic states of said one or more predetermined bits are correct.

15. A method according to claim 13 further including the step of maintaining the logic states of said one or more predetermined bits if it is determined that the original logic states of said one or more predetermined bits are incorrect.

16. A method according to claim 15 wherein the logic states of the one or more predetermined bits are maintained by disabling the error correction operation for the one or more predetermined bits.

17. A method according to claim 11 wherein said error correction system is capable of correcting any number of errors which may occur in a portion of said accessed data word wherein said portion is stored within a single memory chip and wherein said one or more predetermined bits are within the portion of the accessed data word stored within the single memory chip.

18. A method according to claim 17 wherein the step of causing the errors to be passed to the computer system further includes providing separate notifications to the computer system to correspond to the number of errors corrected by said error correction system.

19. A method according to claim 18 wherein the separate notifications are provided to the computer system by passing the incorrect logic state of different ones of the one or more predetermined bits to the computer system each corresponding to the correction of a different number of errors.

20. A method according to claim 11 wherein the error correction system may correct errors occurring to data stored in a set of memory chips having one of a plurality of different memory configurations and wherein said sensing step further includes the step of ascertaining the memory configuration of the plurality of memory chips and wherein the step of causing the errors to be passed to the computer system further includes causing the errors on the appropriate one or more predetermined bits to be passed to the computer system depending upon the ascertained memory configuration.

* * * * *